(12) United States Patent
Komoto et al.

(10) Patent No.: US 11,398,691 B2
(45) Date of Patent: Jul. 26, 2022

(54) CIRCUIT BOARD ASSEMBLY

(71) Applicant: Japan Aviation Electronics Industry, Limited, Tokyo (JP)

(72) Inventors: Tetsuya Komoto, Tokyo (JP); Osamu Hashiguchi, Tokyo (JP); Akihiro Matsunaga, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 114 days.

(21) Appl. No.: 16/915,474

(22) Filed: Jun. 29, 2020

(65) Prior Publication Data

US 2021/0036450 A1 Feb. 4, 2021

(30) Foreign Application Priority Data

Jul. 31, 2019 (JP) .............................. JP2019-140749

(51) Int. Cl.
*H01R 12/71* (2011.01)

(52) U.S. Cl.
CPC .................................. *H01R 12/716* (2013.01)

(58) Field of Classification Search
CPC .............. H01R 12/716; H01R 13/2407; H01R 12/777; H01R 12/778; H01R 12/78; H05K 1/028; H05K 1/118; H05K 2201/09063; H05K 2201/09081; H05K 3/365; H05K 1/147; H05K 1/144
See application file for complete search history.

(56) References Cited

U.S. PATENT DOCUMENTS

| | | | | |
|---|---|---|---|---|
| 4,784,615 A | * | 11/1988 | Teng-Hong | H01R 12/61 439/496 |
| 4,953,060 A | * | 8/1990 | Lauffer | H01L 23/49827 257/713 |
| 5,885,091 A | * | 3/1999 | Belanger, Jr. | H01R 12/52 439/67 |
| 6,447,305 B1 | * | 9/2002 | Roberts | H01R 12/774 439/260 |
| 7,063,561 B2 | * | 6/2006 | Pabst | H01R 12/61 439/498 |

(Continued)

FOREIGN PATENT DOCUMENTS

JP 2019023957 A 2/2019

*Primary Examiner* — Abdullah A Riyami
*Assistant Examiner* — Nelson R. Burgos-Guntin
(74) *Attorney, Agent, or Firm* — Muncy, Geissler, Olds & Lowe, P.C.

(57) ABSTRACT

There is provided a circuit board assembly constructed by stacking a first circuit board having a first contact portion and a second circuit board having a second contact portion to allow the first and second contact portions to contact each other, which is bendable along a first direction. The first circuit board has a first hole that is formed within a range in which a pair of first projection pieces are present in a second direction perpendicular to the first direction, at least part of the first hole being situated between the pair of first projection pieces in the first direction, and the second circuit board has a second hole that is formed within a range in which the pair of second projection pieces are present in the second direction, at least part of the second hole being situated between the pair of second projection pieces in the first direction.

23 Claims, 18 Drawing Sheets

(56) References Cited

U.S. PATENT DOCUMENTS

| | | | | |
|---|---|---|---|---|
| 8,979,551 B2* | 3/2015 | Mongold | H01R 12/73 | 439/74 |
| 9,196,982 B2* | 11/2015 | Sasaki | H01R 12/71 | |
| 9,252,515 B2* | 2/2016 | Komoto | H01R 12/89 | |
| 9,281,587 B2* | 3/2016 | Komoto | H01R 12/716 | |
| 9,293,846 B2* | 3/2016 | Komoto | H01R 13/2442 | |
| 9,787,044 B2* | 10/2017 | Hashiguchi | H01R 12/73 | |
| 10,581,184 B2* | 3/2020 | Tsukashima | H01R 12/57 | |
| 10,785,873 B1* | 9/2020 | Chou | H05K 1/181 | |
| 10,999,938 B1* | 5/2021 | Pevzner | H05K 3/365 | |
| 2009/0135573 A1* | 5/2009 | Sato | H05K 1/144 | 361/803 |
| 2009/0154122 A1* | 6/2009 | Makamura | H05K 1/0293 | 361/761 |
| 2010/0052719 A1* | 3/2010 | Chiu | G01R 1/0416 | 324/760.01 |
| 2011/0212631 A1* | 9/2011 | Iida | H05K 3/365 | 439/74 |
| 2012/0270446 A1* | 10/2012 | Shibata | H01R 12/716 | 439/629 |
| 2013/0012039 A1* | 1/2013 | Nose | H01R 12/716 | 439/74 |
| 2013/0176661 A1* | 7/2013 | Rouvala | H01G 11/84 | 361/502 |
| 2013/0337681 A1* | 12/2013 | Little | H01R 12/716 | 439/569 |
| 2014/0227911 A1* | 8/2014 | Lim | H01R 12/716 | 439/660 |
| 2015/0079817 A1* | 3/2015 | Hashiguchi | H01R 43/205 | 439/75 |
| 2015/0140840 A1* | 5/2015 | Nishimura | H01R 13/6594 | 439/74 |
| 2015/0180148 A1* | 6/2015 | Hashiguchi | H01R 12/716 | 439/74 |
| 2016/0007450 A1* | 1/2016 | Kasper | H05K 1/115 | 174/255 |
| 2016/0181715 A1* | 6/2016 | Schrader | H01R 13/5812 | 439/67 |
| 2017/0034907 A1* | 2/2017 | Iwase | H05K 1/095 | |
| 2017/0093099 A1* | 3/2017 | Talalayev | H01R 24/60 | |
| 2017/0142828 A1* | 5/2017 | Yu | H05K 3/181 | |
| 2017/0148702 A1* | 5/2017 | Funayama | G02F 1/13452 | |
| 2017/0231082 A1* | 8/2017 | Yoshida | H05K 3/0026 | |
| 2018/0007780 A1* | 1/2018 | Takebayashi | H05K 1/028 | |
| 2018/0242469 A1* | 8/2018 | Suzuki | G06F 3/0688 | |
| 2019/0027842 A1* | 1/2019 | Hashiguchi | H01R 4/24 | |
| 2019/0027846 A1* | 1/2019 | Hashiguchi | H01R 12/69 | |
| 2019/0097339 A1* | 3/2019 | Lim | H01R 12/78 | |
| 2019/0157782 A1* | 5/2019 | Hashiguchi | H01R 12/613 | |
| 2020/0227850 A1* | 7/2020 | Do | H01R 13/2407 | |
| 2020/0227851 A1* | 7/2020 | Do | H01R 12/75 | |
| 2020/0315015 A1* | 10/2020 | Kim | G09G 3/20 | |
| 2021/0036450 A1* | 2/2021 | Komoto | H01R 12/716 | |
| 2021/0045229 A1* | 2/2021 | Lim | H05K 1/14 | |
| 2021/0066828 A1* | 3/2021 | Woo | H05K 1/147 | |
| 2021/0076506 A1* | 3/2021 | Yoshikawa | H05K 3/323 | |
| 2021/0126404 A1* | 4/2021 | Laurx | H01R 13/6587 | |
| 2021/0127501 A1* | 4/2021 | Dan | H05K 1/118 | |
| 2021/0136916 A1* | 5/2021 | Kim | H05K 1/028 | |
| 2021/0151804 A1* | 5/2021 | You | H01M 50/296 | |
| 2021/0175666 A1* | 6/2021 | Zhang | H01R 12/716 | |
| 2021/0194162 A1* | 6/2021 | Sugaya | H01R 13/639 | |
| 2021/0212207 A1* | 7/2021 | Xiong | H05K 1/118 | |
| 2021/0242616 A1* | 8/2021 | Omodachi | H01R 13/629 | |
| 2021/0265677 A1* | 8/2021 | Guo | H01M 10/425 | |
| 2021/0337673 A1* | 10/2021 | Eom | G02F 1/13452 | |

* cited by examiner

CIRCUIT BOARD ASSEMBLY

BACKGROUND OF THE INVENTION

The present invention relates to a circuit board assembly, particularly to a bendable circuit board assembly constructed by stacking a first circuit board having a first contact portion and a second circuit board having a second contact portion.

A circuit board assembly constructed by stacking two circuit boards such as a flexible printed circuit (FPC) is described in, for example, JP 2019-023957 A. This circuit board assembly is constructed by stacking a first connector portion 3 having projections 3T, a first circuit board 1 having bendable first contact portions 1C, a second circuit board 2 having bendable second contact portions 2C, and a second connector portion 4 having fitting holes 4H therein, as shown in FIG. 27.

When the above components are assembled together, each first contact portion 1C of the first circuit board 1 and the corresponding second contact portion 2C of the second circuit board 2 are superposed to face each other, and each projection 3T of the first connector portion 3 is fitted into the corresponding fitting hole 4H of the second connector portion 4 as catching the superposed first and second contact portions 1C and 2C. As a result, as shown in FIG. 28, the first contact portion 1C and the second contact portion 2C are elastically pressed against and contact each other between a lateral surface 5 of the projection 3T and an inner surface 6 of the fitting hole 4H, thus establishing electrical connection.

The circuit board assembly assembled in the foregoing manner is configured such that the first contact portion 1C and the second contact portion 2C are bent to contact each other between the lateral surface 5 of the projection 3T and the inner surface 6 of the fitting hole 4H, and the circuit board assembly has an extremely thin structure in the thickness direction thereof (i.e., the Z direction in FIG. 27).

When the first circuit board 1, the second circuit board 2, the first connector portion 3 and the second connector portion 4 described above are flexible plate bodies, the circuit board assembly constructed by stacking those components have flexibility and are bendable along the Y direction of FIG. 27. A circuit board assembly having such flexibility is flexibly bendable (deformable) in accordance with, for instance, the shape of the place where the assembly is mounted; at the same time, the circuit board assembly needs to be hard to break even when bent many times. In other words, for a bendable circuit board assembly, there is a demand for reducing a load (tensile stress load) imparted to each constituent circuit board when the circuit board assembly is bent, thereby suppressing the occurrence of breakage caused by the load.

SUMMARY OF THE INVENTION

The present invention has been made in view of the above circumstances and is aimed at solving an object described below.

An object of the invention is to solve the above problem of the conventional art by providing a circuit board assembly capable of suppressing the occurrence of breakage caused by a tensile stress load that may be imparted to each constituent circuit board when the circuit board assembly is bent.

In order to achieve the above objects, the invention provides a circuit board assembly that is constructed by stacking a first circuit board having a first contact portion and a second circuit board having a second contact portion to allow the first contact portion and the second contact portion to contact each other and that is bendable along a first direction, the circuit board assembly comprising: a pair of first projection pieces that are formed by cutting the first circuit board in the first contact portion and project in opposite directions from each other in the first direction; and a pair of second projection pieces that are formed by cutting the second circuit board in the second contact portion and project in opposite directions from each other in the first direction, wherein the first circuit board has a first hole that is formed within a range in which the pair of first projection pieces are present in a second direction perpendicular to the first direction, at least part of the first hole being situated between the pair of first projection pieces in the first direction, and the second circuit board has a second hole that is formed within a range in which the pair of second projection pieces are present in the second direction, at least part of the second hole being situated between the pair of second projection pieces in the first direction.

The invention provides another circuit board assembly that is constructed by stacking a first circuit board having a first contact portion and a second circuit board having a second contact portion to allow the first contact portion and the second contact portion to contact each other and that is bendable along a first direction, the circuit board assembly comprising: a first projection piece formed by cutting the first circuit board in the first contact portion; and a second projection piece formed by cutting the second circuit board in the second contact portion, wherein the first circuit board has a first hole that is formed within a range in which the first projection piece is present in a second direction perpendicular to the first direction, at least part of the first hole being situated at a base portion of the first projection piece in the first direction, and the second circuit board has a second hole that is formed within a range in which the second projection piece is present in the second direction, at least part of the second hole being situated at a base portion of the second projection piece in the first direction.

DETAILED DESCRIPTION OF THE INVENTION

A circuit board assembly of the present invention is described below with reference to some preferred embodiments (Embodiments 1 to 4) illustrated in the appended drawings. However, the embodiments described below are only examples used to facilitate the understanding of the invention, and the invention is by no means limited thereto. In other words, the invention may be modified or improved from the embodiments described below without departing from the scope and spirit of the invention. In particular, the material, size and other factors of members used in the invention can be freely determined depending on the application of the invention, the state of the art at the time when the invention is carried out, and other conditions. Needless to say, the invention includes its equivalents.

In the following description, for convenience of description, three directions crossing perpendicularly to one another are defined as an X direction, a Y direction and a Z direction, where it is assumed that the thickness direction of the circuit board assembly is equal to the Z direction and the circuit board assembly extends along an XY plane. The Y direction is equal to a "first direction" of the invention, and the X direction a "second direction" of the invention.

Embodiment 1

Figure 1:
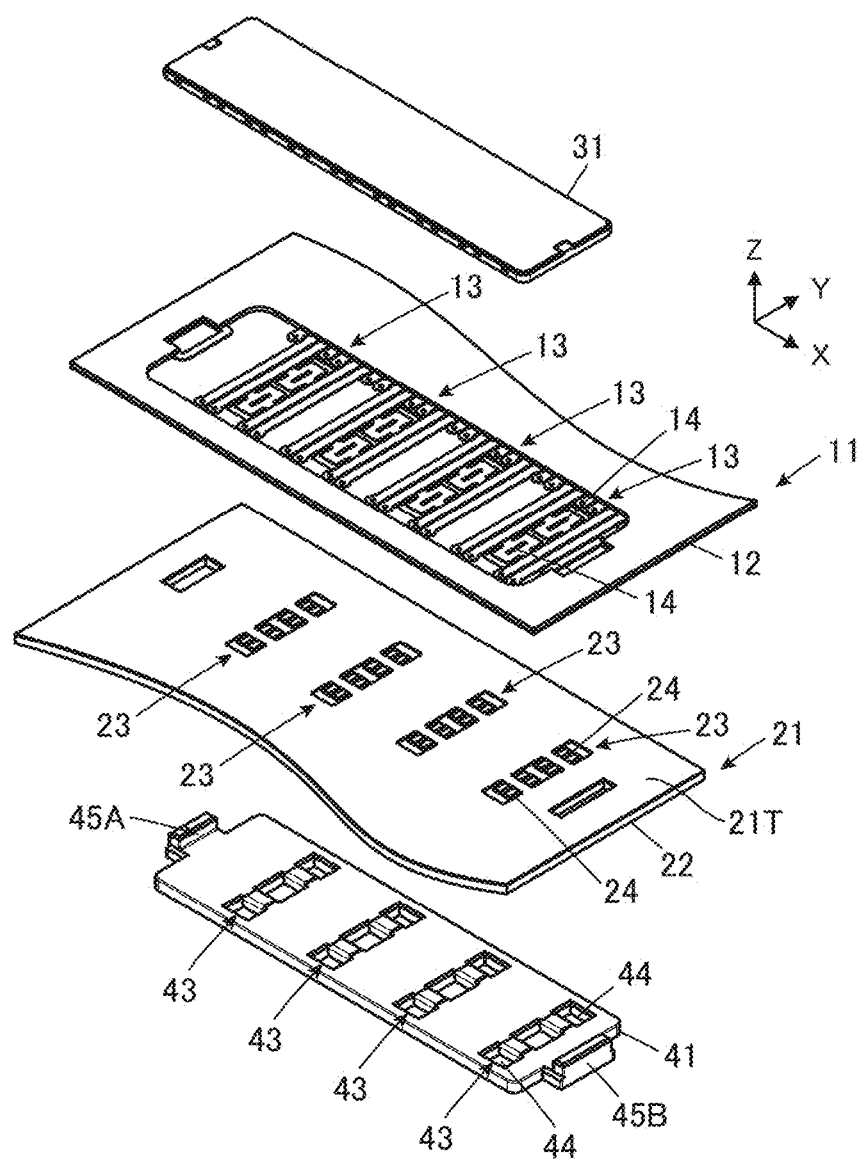
FIG. 1 is a view of a first connector portion, a first circuit board, a second circuit board and a second connector portion of a circuit board assembly according to Embodiment 1 of the present invention before assembling, when viewed from an obliquely upper position.
Figure 2:
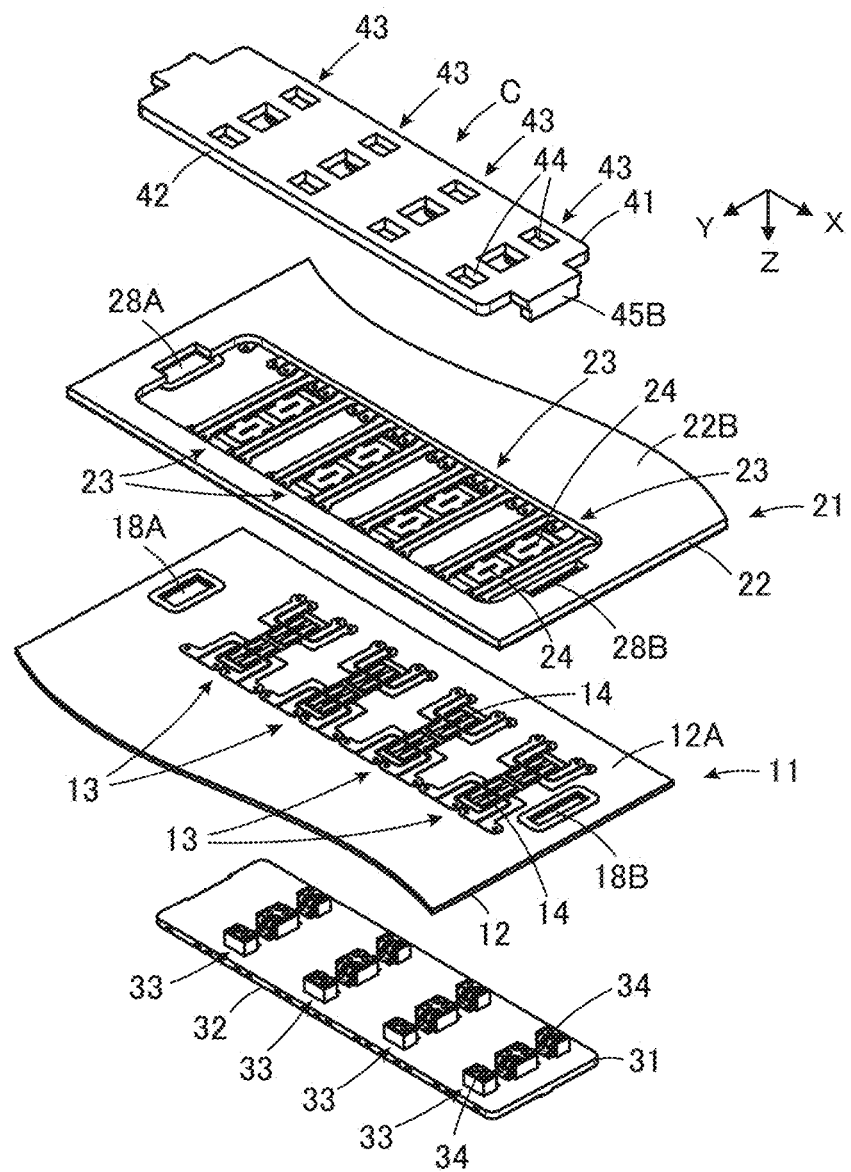
FIG. 2 is a view of the first connector portion, the first circuit board, the second circuit board and the second connector portion of the circuit board assembly according to Embodiment 1 before assembling, when viewed from an obliquely lower position.

A circuit board assembly according to Embodiment 1 is constructed by assembling a first circuit board 11, a second circuit board 21 and a connector C shown in FIGS. 1 and 2 together. FIGS. 1 and 2 are perspective views showing the first circuit board 11, the second circuit board 21 and the connector C before assembling. The connector C is composed of a first connector portion 31 and a second connector portion 41 that can fit with each other. The first circuit board 11, the second circuit board 21, the first connector portion 31 and the second connector portion 41 are flexible members of flat plate shape and are arranged in parallel to each other. The first circuit board 11 and the second circuit board 21 are sequentially disposed between the first connector portion 31 and the second connector portion 41.

The circuit board assembly having been assembled extends along an XY plane, has flexibility, can be bent along the Y direction, and for instance, can be suitably bent in accordance with the place where the assembly is mounted as well as the displacement of the place. The expression "bent along the Y direction" refers to being bent along a line (bending line) extending in the Y direction as a starting point.

Next, the configurations of the first circuit board 11, the second circuit board 21, the first connector portion 31 and the second connector portion 41 are each described. In the following description, for convenience, the side on which the first connector portion 31 is situated when viewed from the second connector portion 41 side is called "+Z side."

[First Circuit Board]

Figure 3:
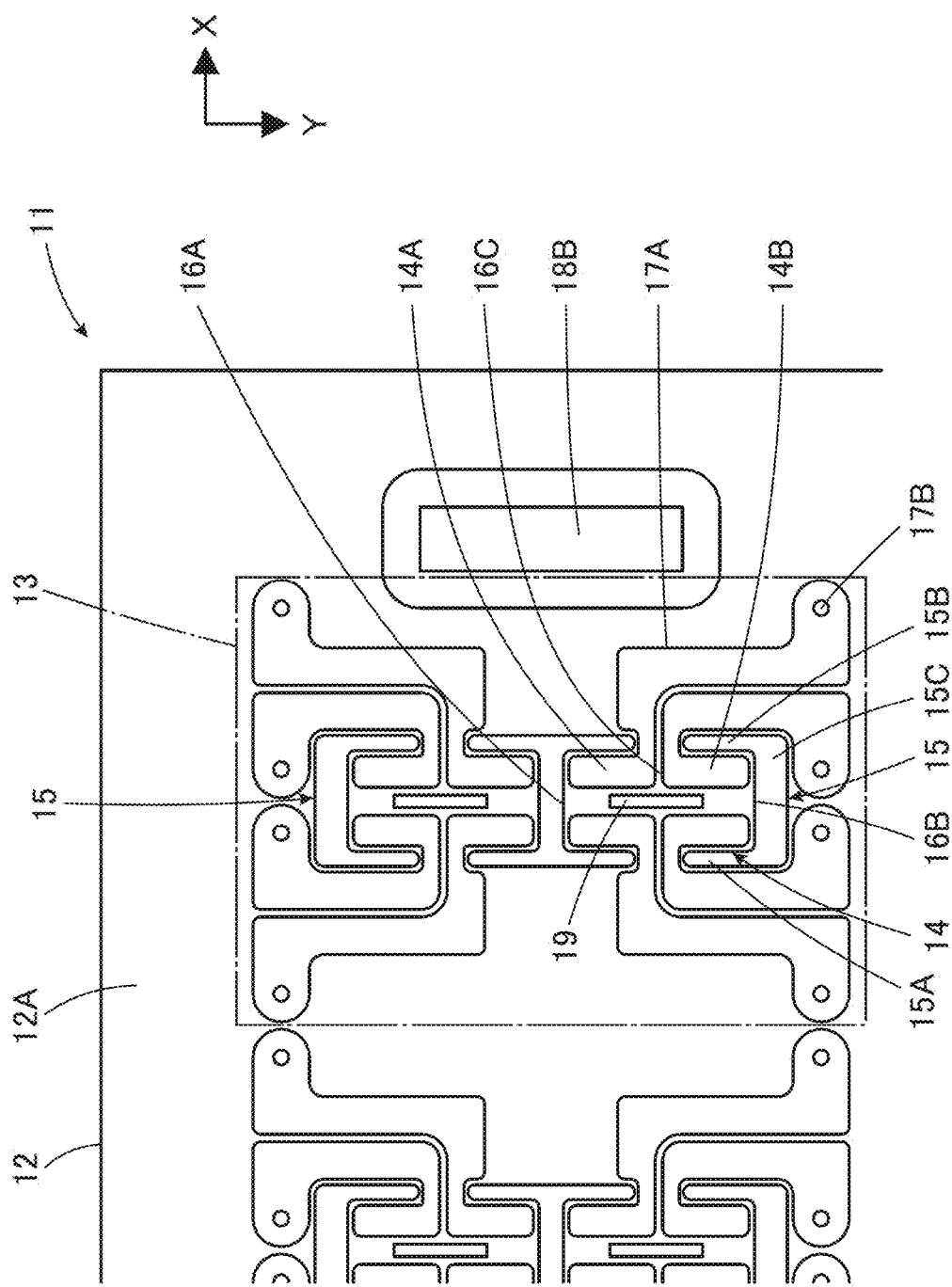
FIG. 3 is an enlarged partial view showing a top surface of the first circuit board according to Embodiment 1.
Figure 4:
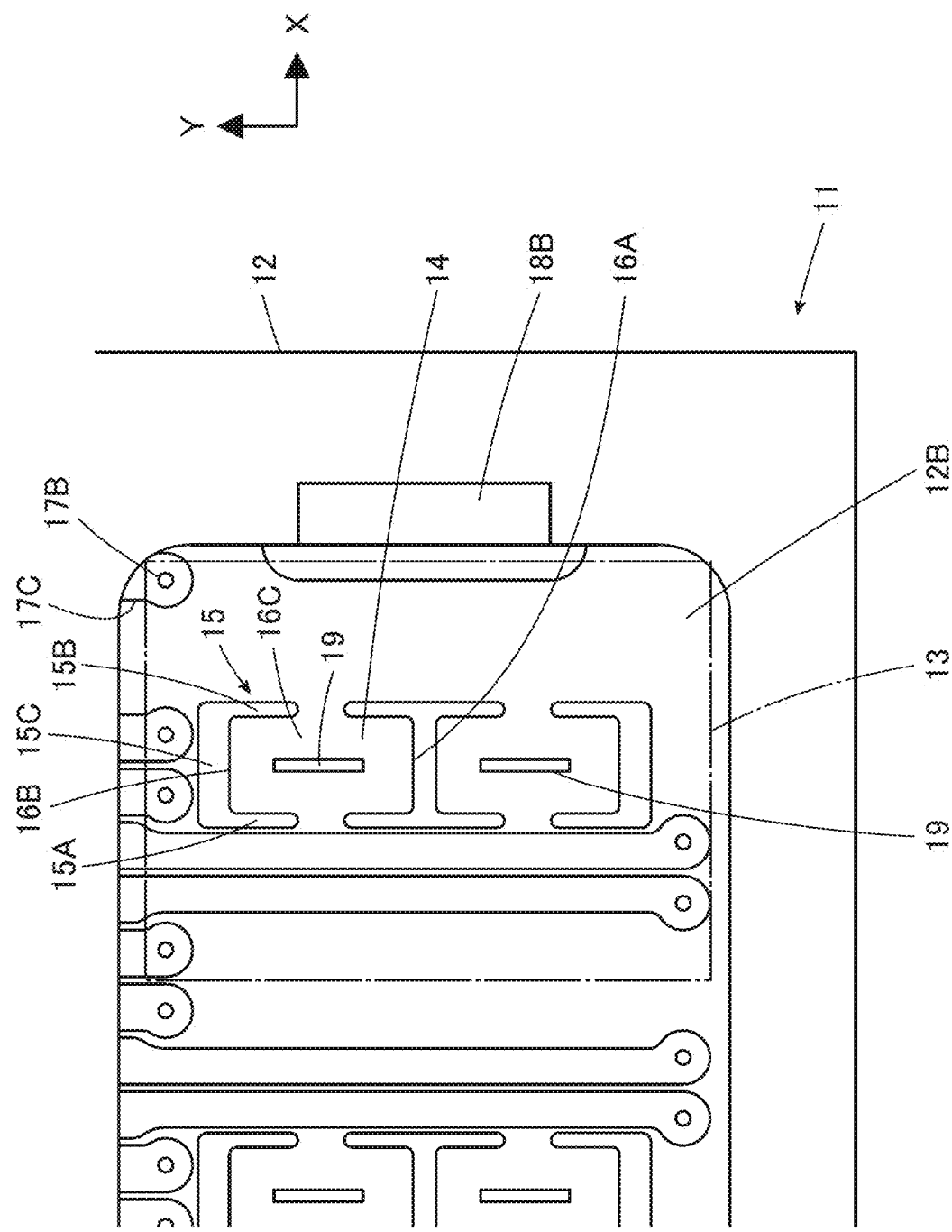
FIG. 4 is an enlarged partial view showing a bottom surface of the first circuit board according to Embodiment 1.

As shown in FIGS. 3 and 4, the first circuit board 11 includes a flexible, insulating first substrate 12, on which four first contact portion groups 13 are aligned at regular intervals in the X direction that is the width direction of the first circuit board 11, each first contact portion group 13 being composed of two first contact portions 14 aligned in the Y direction that is the length direction of the first circuit board 11. FIGS. 3 and 4 are enlarged partial views showing a top surface and a bottom surface of the first circuit board 11, respectively.

The number of the first contact portions 14 aligned in the Y direction in each first contact portion group 13 is not limited to two and may be one or more. Similarly, the number of the first contact portion groups 13 is not limited to four and may be one or more.

Of the two first contact portions 14 of each of the four first contact portion groups 13, the first contact portion 14 on the +Y side is situated at the same position in the Y direction among the first contact portion groups 13. The first contact portion 14 on the −Y side is also situated at the same position in the Y direction among the first contact portion groups 13. However, the arrangement is not limited thereto; the first contact portions 14 on the +Y side may be situated in different positions in the Y direction among the first contact portion groups 13, and the same applies to the first contact portions 14 on the −Y side.

As shown in FIG. 3, each of the two first contact portions 14 of each first contact portion group 13 has a pair of first projection pieces 16A and 16B aligned in the Y direction and is bendable at the base portions of the first projection pieces 16A and 16B. The pair of first projection pieces 16A and 16B project in the opposite directions from (i.e., directions away from) each other in the Y direction; the first projection piece 16A projects toward the −Y side, and the first projection piece 16B projects toward the +Y side at the same position as the first projection piece 16A in the X direction and is joined to the +Y side end of the first projection piece 16A through a first projection piece joint portion 16C.

Each of the pair of first projection pieces 16A and 16B has a rectangular shape in a plan view as shown in FIG. 3 and is formed by cutting out the first substrate 12 of the first circuit board 11 in a U-shape or inverted U-shape. In other words, a first cutout portion 15 that is an opening penetrating the first substrate 12 in the Z direction is situated to adjoin the edge of each of the first projection pieces 16A and 16B in the first substrate 12. As shown in FIG. 3, the first cutout portion 15 has a pair of cutout lateral portions 15A and 15B extending in the Y direction and a cutout connecting portion 15C extending in the X direction and interconnecting the pair of cutout lateral portions 15A and 15B. Terminal ends of the pair of cutout lateral portions 15A and 15B adjoin the base portions of the adjacent first projection pieces 16A and 16B, respectively, and the other ends of the pair of cutout lateral portions 15A and 15B are interconnected by the cutout connecting portion 15C.

In each first contact portion group 13, the first cutout portion 15 adjoining the first projection piece 16A of the first contact portion 14 on the +Y side and another first cutout portion 15 adjoining the first projection piece 16B of the first contact portion 14 on the −Y side are configured such that their cutout connecting portions 15C are adjacent to and communicate with each other, thus forming a substantially H-shaped opening.

On the top surface 12A of the first substrate 12, as shown in FIG. 3, a pair of conductive first contacts 14A are formed separately at the −X side end and the +X side end of the first projection piece 16A, while a pair of conductive first contacts 14B are formed separately at the −X side end and the +X side end of the first projection piece 16B. That is, one first contact portion 14 is provided with four contacts in total consisting of the pair of first contacts 14A and the pair of first contacts 14B. These four contacts are insulated from one another, and are each connected to a corresponding conductive first wiring portion 17A and then to a corresponding conductive first wiring portion 17C on the bottom surface 12B of the first substrate 12 shown in FIG. 4 through the first wiring portion 17A and a via 17B.

As shown in FIG. 4, the first projection pieces 16A and 16B formed of part of the first substrate 12 having insulation properties are exposed as they are on the bottom surface 12B of the first substrate 12.

As shown in FIGS. 1 and 2, the first circuit board 11 has positioning through-holes 18A and 18B of rectangular shape that are formed separately on the −X and +X sides of the four first contact portion groups 13 aligned in the X direction. The positioning through-hole 18B on the +X side has a Y directional length larger than that of the positioning through-hole 18A on the −X side.

As shown in FIG. 3, the first substrate 12 of the first circuit board 11 has rectangular first holes 19 each formed within a range in which the first projection pieces 16A and 16B are present in the X direction. Each first hole 19 is situated in a region where the first contact portion 14 is formed in the first substrate 12. The first hole 19 penetrates the first substrate 12 in the Z direction and extends along the Y direction. At least part of the first hole 19 is situated between the pair of first projection pieces 16A and 16B in the Y direction and also at the base portions of the first projection pieces 16A and 16B in the Y direction. More specifically, the first hole 19 is formed at the position in the Y direction to cross the base portions of the pair of first projection pieces 16A and 16B of each first contact portion 14 and the first projection piece joint portion 16C therebetween. The first hole 19 is formed between the opposite ends (ends on the opposite sides) of each of the pair of first projection pieces 16A and 16B in the X direction and situated in the middle portion of the first projection pieces 16A and 16B in the X direction.

As shown in FIG. 3, in the X direction, the −Y side end of the first hole 19 is situated between the pair of first contacts 14A provided in the first projection piece 16A, and +Y side end of the first hole 19 is situated between the pair of first contacts 14B provided in the first projection piece 16B. That is, the first hole 19 is provided within a space between the pair of first contacts 14A and a space between the pair of first contacts 14B in the X direction. The X directional length of the first hole 19 is smaller than the distance between the pair of first contacts 14A and the distance between the pair of first contacts 14B in the X direction. In other words, the first hole 19 is provided at a position away from the pairs of first contacts 14A and 14B and the first wiring portions 17A separately connected to the pairs of first contacts 14A and 14B.

Further, as shown in FIG. 3, the first hole 19 passes the same position in the Y direction as the terminal ends of the pair of cutout lateral portions 15A and 15B of the first cutout portion 15 adjoining the first projection piece 16A and also passes the same position in the Y direction as the terminal ends of the pair of cutout lateral portions 15A and 15B of the first cutout portion 15 adjoining the first projection piece 16B. In the Y direction, the −Y side end (i.e., the end closer to the −Y side end of the first projection piece 16A) of the first hole 19 is separated by some distance from the −Y side end (free end) of the first projection piece 16A toward the +Y side, and the +Y side end (i.e., the end closer to the +Y side end of the first projection piece 16B) of the first hole 19 is separated by some distance from the +Y side end (free end) of the first projection piece 16B toward the −Y side.

[Second Circuit Board]

Figure 5:
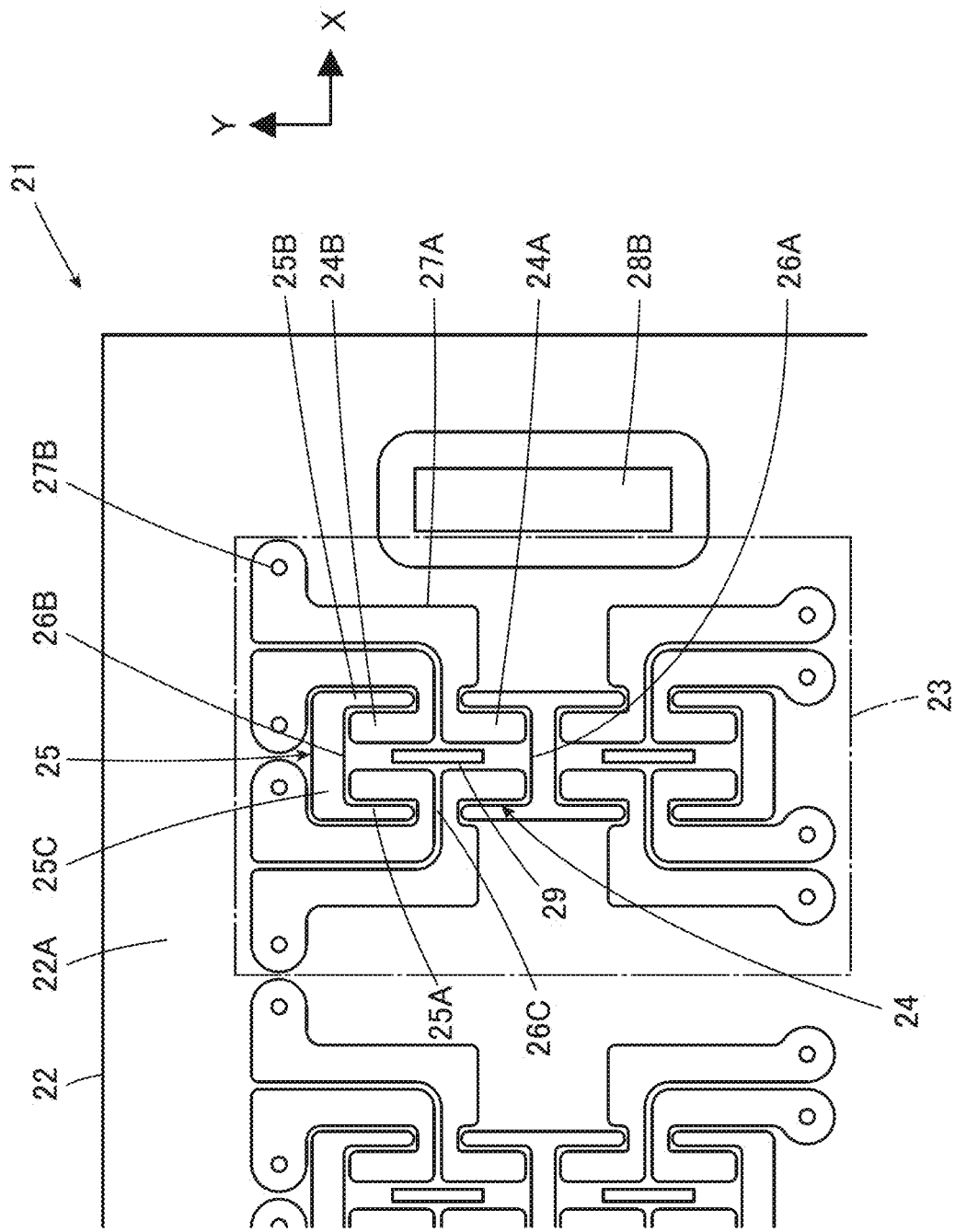
FIG. 5 is an enlarged partial view showing a top surface of the second circuit board according to Embodiment 1.
Figure 6:
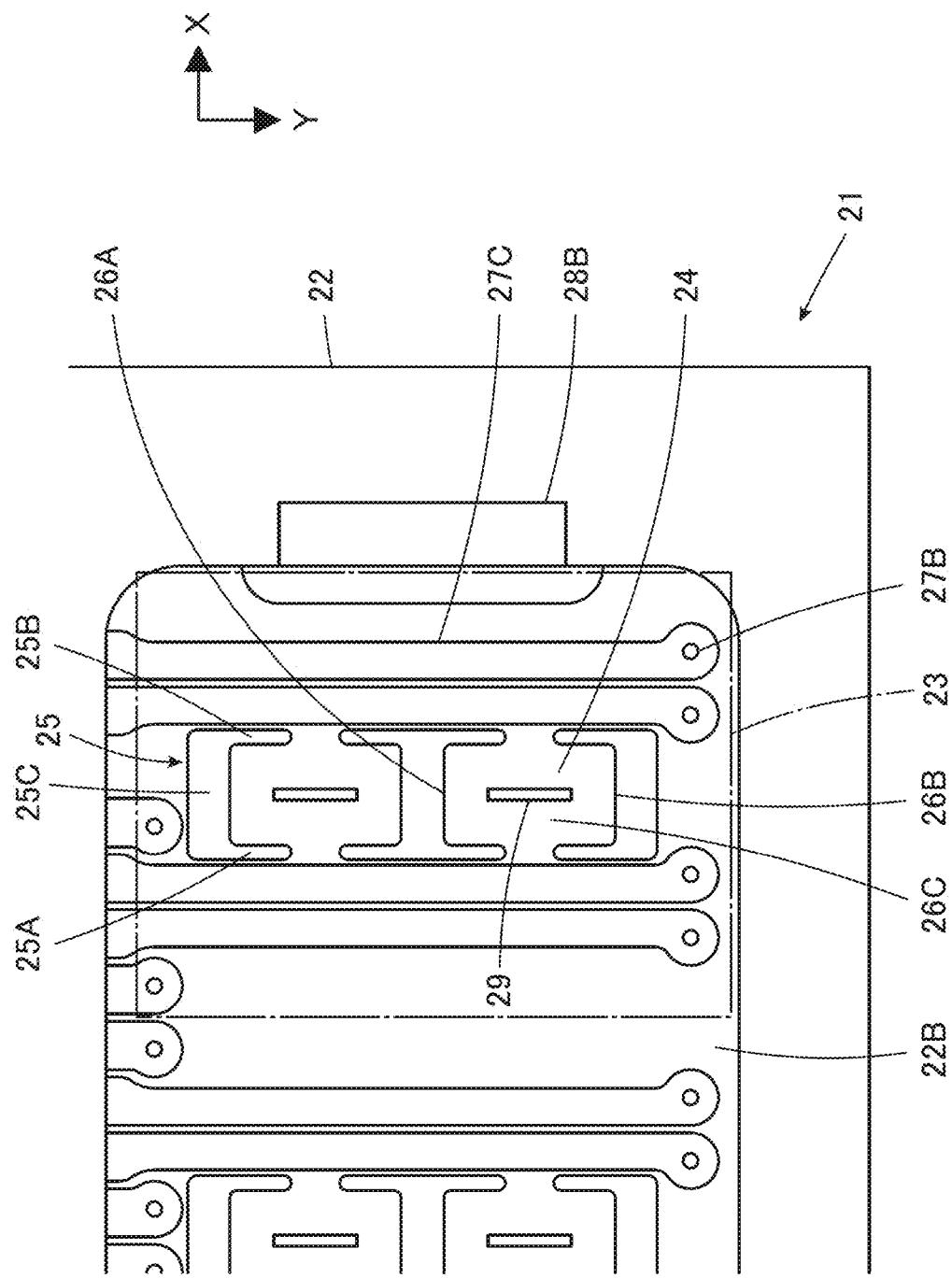
FIG. 6 is an enlarged partial view showing a bottom surface of the second circuit board according to Embodiment 1.

The second circuit board 21 has the same configuration as the first circuit board 11. Specifically, as shown in FIGS. 5 and 6, the second circuit board 21 includes a flexible, insulating second substrate 22, on which four second contact portion groups 23 are aligned at regular intervals in the X direction that is the width direction of the second circuit board 21, each second contact portion group 23 being composed of two second contact portions 24 aligned in the Y direction that is the length direction of the second circuit board 21. FIGS. 5 and 6 are enlarged partial views showing a top surface and a bottom surface of the second circuit board 21, respectively.

The number of the second contact portions 24 aligned in the Y direction in each second contact portion group 23 is not limited to two, may be one or more, and only needs to be the same as the number of the first contact portions 14 of each first contact portion group 13 in the first circuit board 11. Similarly, the number of the second contact portion groups 23 may be one or more and should be the same as the number of the first contact portion groups 13.

Of the two second contact portions 24 of each of the four second contact portion groups 23, the second contact portion 24 on the +Y side is situated at the same position in the Y direction among the second contact portion groups 23. The second contact portion 24 on the −Y side is also situated at the same position in the Y direction among the second contact portion groups 23. However, the second contact portions 24 on the +Y side may be situated in different positions in the Y direction among the second contact portion groups 23, and the same applies to the second contact portions 24 on the −Y side.

When a specific region in the top surface 12A of the first substrate 12 and a specific region in the top surface 22A of the second substrate 22 are superposed, each of the eight second contact portions 24 in the second circuit board 21 coincides with the corresponding one of the eight first contact portions 14 in the first circuit board 11 in the X and Y directions.

As shown in FIG. 5, each of the two second contact portions 24 of each second contact portion group 23 has a pair of second projection pieces 26A and 26B aligned in the Y direction and is bendable at the base portions of the second projection pieces 26A and 26B. The pair of second projection pieces 26A and 26B project in the opposite directions from (i.e., directions away from) each other in the Y direction; the second projection piece 26A projects toward the −Y side, and the second projection piece 26B projects toward the +Y side at the same position as the second projection piece 26A in the X direction and is joined to the +Y side end of the second projection piece 26A through a second projection piece joint portion 26C.

Each of the pair of second projection pieces 26A and 26B has a rectangular shape in a plan view as shown in FIG. 5 and is formed by cutting out the second substrate 22 of the second circuit board 21 in a U-shape or inverted U-shape. In other words, a second cutout portion 25 that is an opening penetrating the second substrate 22 in the Z direction is situated to adjoin the edge of each of the second projection pieces 26A and 26B in the second substrate 22. As shown in FIG. 5, the second cutout portion 25 has a pair of cutout lateral portions 25A and 25B extending in the Y direction and a cutout connecting portion 25C extending in the X direction and interconnecting the pair of cutout lateral portions 25A and 25B. Terminal ends of the pair of cutout lateral portions 25A and 25B adjoin the base portions of the adjacent second projection pieces 26A and 26B, respectively, and the other ends of the pair of cutout lateral portions 25A and 25B are interconnected by the cutout connecting portion 25C.

In each second contact portion group 23, the second cutout portion 25 adjoining the second projection piece 26A of the second contact portion 24 on the +Y side and another second cutout portion 25 adjoining the second projection piece 26B of the second contact portion 24 on the −Y side are configured such that their cutout connecting portions 25C are adjacent to each other to communicate each other, thus forming a substantially H-shaped opening.

On the top surface 22A of the second substrate 22, as shown in FIG. 5, a pair of conductive second contacts 24A are formed separately at the −X side end and the +X side end of the second projection piece 26A, while a pair of conductive second contacts 24B are formed separately at the −X side end and the +X side end of the second projection piece 26B. That is, one second contact portion 24 is provided with four contacts in total consisting of the pair of second contacts 24A and the pair of second contacts 24B. These four contacts are insulated from one another, and are each connected to a corresponding conductive second wiring portion 27A and then to a corresponding conductive second wiring portion 27C on the bottom surface 22B of the second substrate 22 shown in FIG. 6 through the second wiring portion 27A and a via 27B.

As shown in FIG. 6, the second projection pieces 26A and 26B formed of part of the second substrate 22 having insulation properties are exposed as they are on the bottom surface 22B of the second substrate 22.

As shown in FIGS. 1 and 2, the second circuit board 21 has positioning through-holes 28A and 28B of rectangular shape that are formed separately on the −X and +X sides of the four second contact portion groups 23 aligned in the X direction. The positioning through-holes 28A and 28B have Y directional lengths slightly larger than those of the positioning through-holes 18A and 18B of the first circuit board 11, respectively. The positioning through-hole 28B on the +X side has a Y directional length larger than that of the positioning through-hole 28A on the −X side.

As shown in FIG. 5, the second substrate 22 of the second circuit board 21 has rectangular second holes 29 each formed within a region in which the second projection pieces 26A and 26B are present in the X direction. Each second hole 29 is situated in a region where the second contact portion 24 is formed in the second substrate 22. The second hole 29 penetrates the second substrate 22 in the Z direction and extends along the Y direction. At least part of the second hole 29 is situated between the pair of second projection pieces 26A and 26B in the Y direction and also at the base portions of the second projection pieces 26A and 26B in the Y direction. More specifically, the second hole 29 is formed at the position in the Y direction to cross the base portions of the pair of second projection pieces 26A and 26B of each second contact portion 24 and the second projection piece joint portion 26C therebetween. The second hole 29 is formed between the opposite ends (ends on the opposite sides) of each of the pair of second projection pieces 26A and 26B in the X direction and situated in the middle portion of the second projection pieces 26A and 26B in the X direction.

As shown in FIG. 5, in the X direction, the −Y side end of the second hole 29 is situated between the pair of second contacts 24A provided in the second projection piece 26A, and +Y side end of the second hole 29 is situated between the pair of second contacts 24B provided in the second projection piece 26B. That is, the second hole 29 is provided within a space between the pair of second contacts 24A and a space between the pair of second contacts 24B in the X direction. The X directional length of the second hole 29 is smaller than the distance between the pair of second contacts 24A and the distance between the pair of second contacts 24B in the X direction. In other words, the second hole 29 is provided at a position away from the pairs of second contacts 24A and 24B and the second wiring portions 27A separately connected to the pairs of second contacts 24A and 24B.

Further, as shown in FIG. 5, the second hole 29 passes the same position in the Y direction as the terminal ends of the pair of cutout lateral portions 25A and 25B of the second cutout portion 25 adjoining the second projection piece 26A and also passes the same position in the Y direction as the terminal ends of the pair of cutout lateral portions 25A and 25B of the second cutout portion 25 adjoining the second projection piece 26B. In the Y direction, the −Y side end (i.e., the end close to the −Y side end of the second projection piece 26A) of the second hole 29 is separated by some distance from the −Y side end (free end) of the second projection piece 26A toward the +Y side, and the +Y side end (i.e., the end close to the +Y side end of the second projection piece 26B) of the second hole 29 is separated by some distance from the +Y side end (free end) of the second projection piece 26B toward the −Y side.

Figure 7:
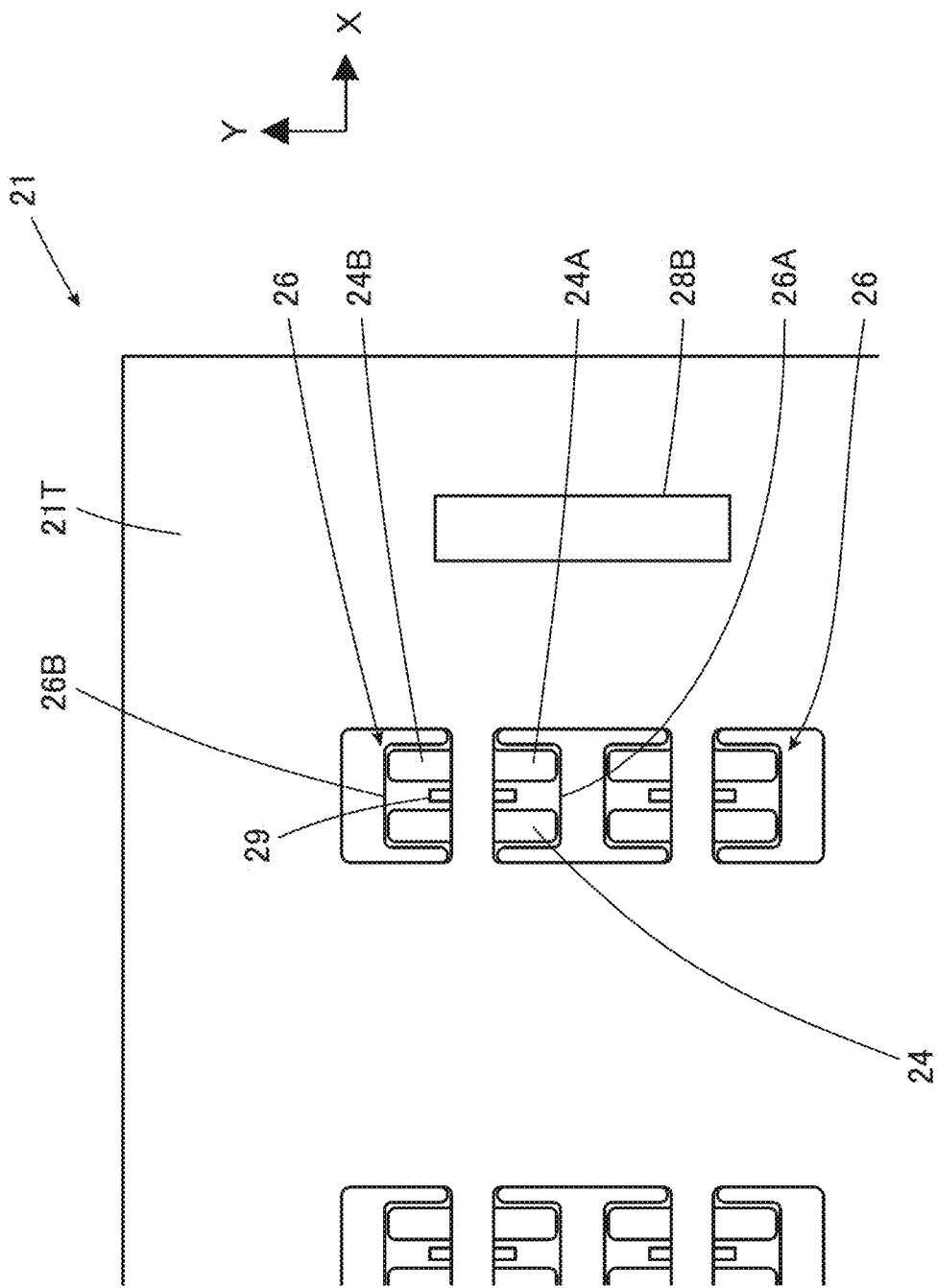
FIG. 7 is an enlarged partial view showing the second circuit board provided on its top surface with an insulating layer.

As shown in FIG. 7, the second circuit board 21 is further provided with an insulating layer 21T. FIG. 7 is an enlarged partial view showing the second circuit board 21 having on its top surface the insulating layer 21T. Owing to the insulating layer 21T, the first wiring portions 17A of the first circuit board 11 and the second wiring portions 27A of the second circuit board 21 are prevented from short-circuiting when the first connector portion 31 and the second connector portion 41 of the connector C are fitted with each other and the first circuit board 11 and the second circuit board 21 are superposed with their top surfaces facing each other. The insulating layer 21T is formed on the top surface 22A of the second substrate 22 and covers the entire top surface 22A except the second projection pieces 26A and 26B of the second contact portions 24, the pairs of second contacts 24A and the pairs of second contacts 24B formed on the surfaces of the second projection pieces 26A and 26B, and the positioning through-holes 28A and 28B.

While the insulating layer 21T is provided to the second circuit board 21 in the configuration shown in FIG. 1, an insulating layer may be provided to the top surface of the first circuit board 11 instead of the second circuit board 21, and alternatively, insulating layers may be provided to the top surfaces of both first and second circuit boards 11 and 21.

[First Connector Portion]

Figure 8:
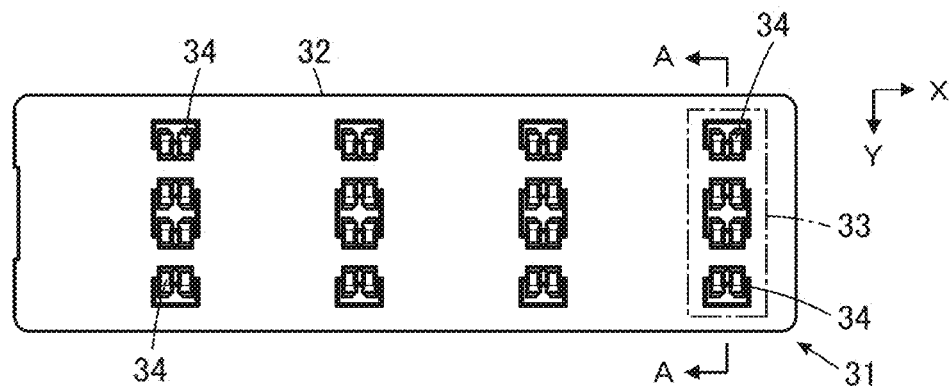
FIG. 8 is a bottom view showing the first connector portion according to Embodiment 1.

As shown in FIGS. 1 and 2, the first connector portion 31 of the connector C has a flexible base plate 32 having insulation properties, and as shown in FIG. 8, four projection groups 33 are aligned in the X direction at regular intervals in the base plate 32, each projection group 33 being composed of two projections 34 aligned in the Y direction. FIG. 8 is a bottom view showing the first connector portion 31.

The number of the projections 34 aligned in the Y direction in each projection group 33 is not limited to two, may be one or more, and only needs to be the same as the number of the first contact portions 14 of each first contact portion group 13 in the first circuit board 11. Similarly, the number of the projection groups 33 may be one or more and should be the same as the number of the first contact portion groups 13.

The arrangement pitch of the projection groups 33 in the X direction in the first connector portion 31 coincides with that of the first contact portion groups 13 in the first circuit board 11 and that of the second contact portion groups 23 in the second circuit board 21. The distance in the Y direction between the two projections 34 in each projection group 33 coincides with that between the two first contact portions 14 in each first contact portion group 13 and that between the two second contact portions 24 in each second contact portion group 23.

Figure 9:
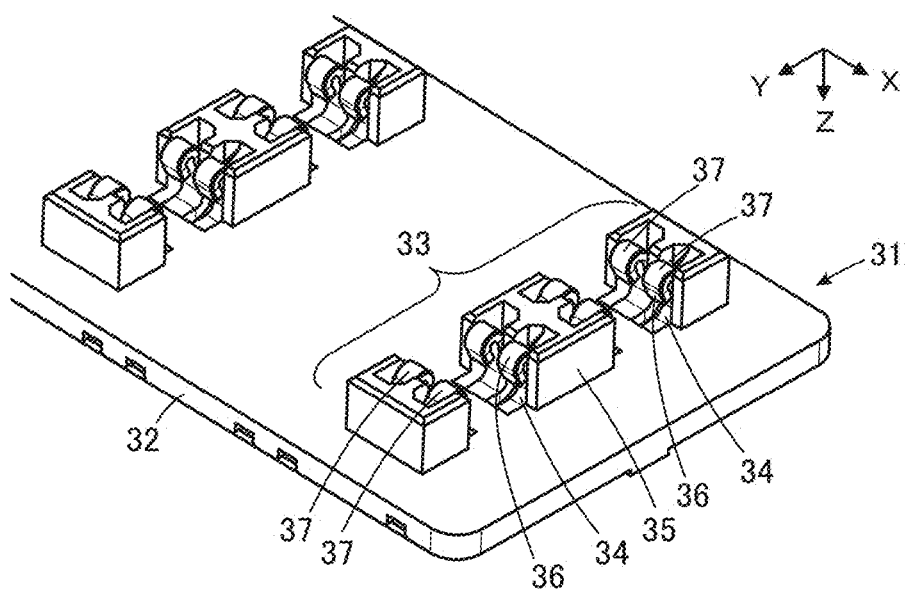
FIG. 9 is a partial perspective view of the first connector portion according to Embodiment 1 when viewed from an obliquely lower position.

Each of the two projections 34 of each projection group 33 is provided on the surface of the base plate 32, is formed of, for instance, a metal spring as shown in FIG. 9, and has a pair of spring pieces 36 facing each other in the Y direction. FIG. 9 is a partial perspective view of the first connector portion 31 as viewed from an obliquely lower position. Each spring piece 36 is divided into two arm portions 37 arranged side by side in the X direction, projects toward the −Z side from the base plate 32, and has elasticity in the Y direction.

Figure 10:
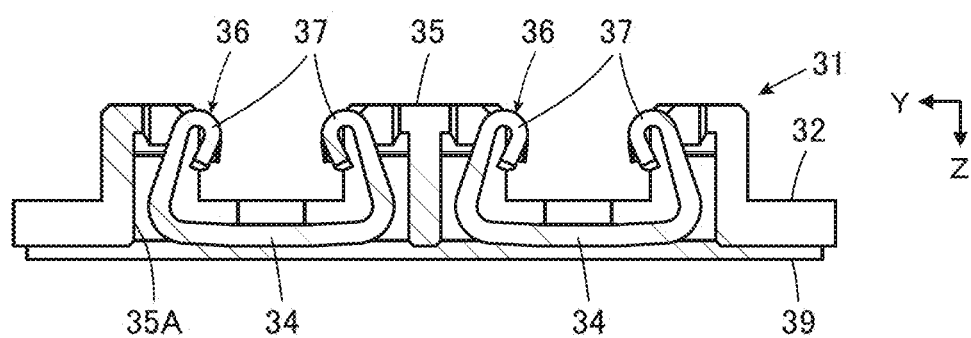
FIG. 10 is a cross-sectional view taken along line A-A in FIG. 8.

A protection wall portion 35 is formed on the surface of the base plate 32 on the −Z side in a region where each projection group 33 is formed on the base plate 32, and extends toward the −Z side from the base plate 32 so as to surround each projection 34. As shown in FIG. 10, the protection wall portion 35 extends farther toward the −Z side than the projection 34. FIG. 10 is a cross-sectional view taken along line A-A in FIG. 8.

The base plate 32 has a through-hole 35A in a region surrounded by the protection wall portion 35, and the projection 34 is held by the base plate 32 while being inserted in the through-hole 35A. As shown in FIG. 10, an insulating sheet 39 is fixed on the surface of the base plate 32 on the +Z side, and the part of the projection 34 that faces toward the +Z side is covered with the insulating sheet 39.

[Second Connector Portion]

Figure 11:
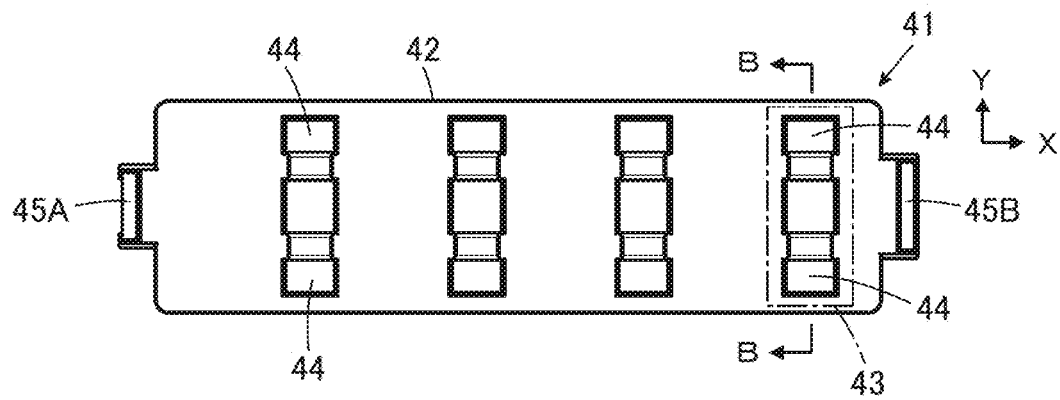
FIG. 11 is a plan view showing the second connector portion according to Embodiment 1.

As shown in FIGS. 1 and 2, the second connector portion 41 of the connector C has a flexible fitting plate 42 having insulation properties, and as shown in FIG. 11, four fitting hole groups 43 are aligned in the X direction in the fitting plate 42, each fitting hole group 43 being composed of two fitting holes 44 aligned in the Y direction. FIG. 11 is a plan view showing the second connector portion 41.

The number of the fitting holes 44 aligned in the Y direction in each fitting hole group 43 is not limited to two, may be one or more, and only needs to be the same as the number of the first contact portions 14 of each first contact portion group 13 in the first circuit board 11. Similarly, the number of the fitting hole groups 43 may be one or more and should be the same as the number of the first contact portion groups 13.

The arrangement pitch of the fitting hole groups 43 in the X direction in the second connector portion 41 coincides with that of the first contact portion groups 13 in the first circuit board 11 and that of the second contact portion groups 23 in the second circuit board 21. The distance in the Y direction between the two fitting holes 44 in each fitting hole group 43 coincides with that between the two first contact portions 14 in each first contact portion group 13 and that between the two second contact portions 24 in each second contact portion group 23.

Figure 12:
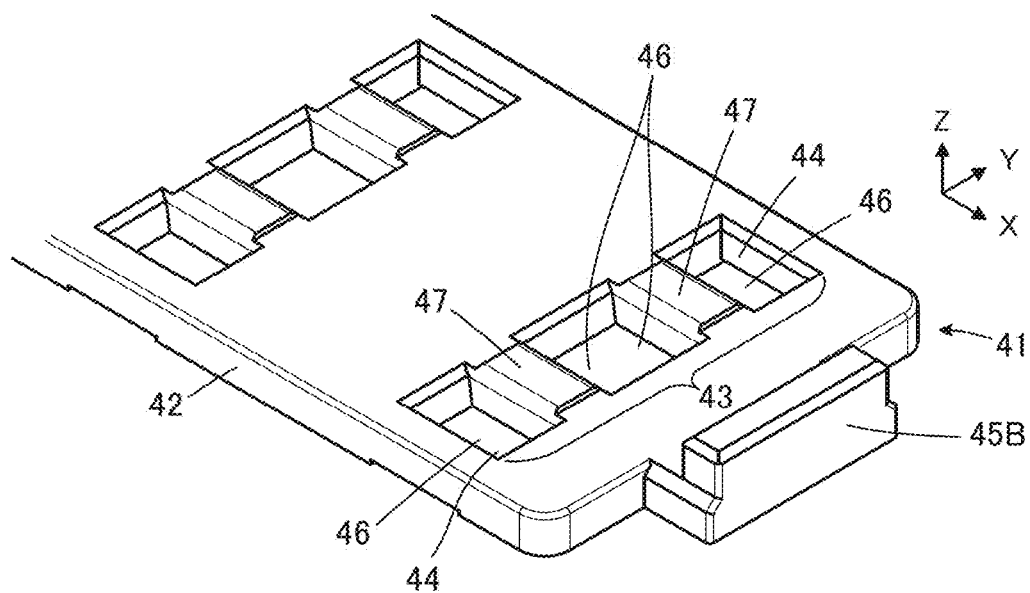
FIG. 12 is a partial perspective view of the second connector portion according to Embodiment 1 when viewed from an obliquely upper position.

As shown in FIG. 12, each of the two fitting holes 44 of each fitting hole group 43 has a pair of spring piece insertion holes 46 penetrating the fitting plate 42 in the Z direction and separated from each other in the Y direction. When the first connector portion 31 and the second connector portion 41 are fitted to each other, the pair of spring pieces 36 of each projection 34 of the first connector portion 31 are inserted into the corresponding pair of spring piece insertion holes 46. FIG. 12 is a partial perspective view of the second connector portion 41 as viewed from an obliquely upper position.

Figure 13:
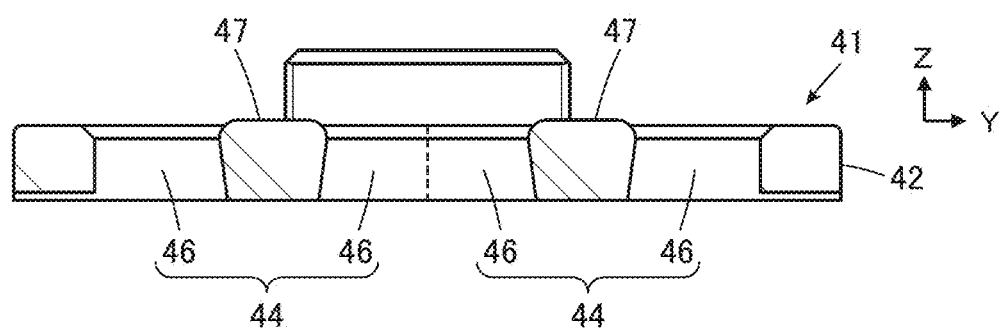
FIG. 13 is a cross-sectional view taken along line B-B in FIG. 11.

As shown in FIG. 13, in each fitting hole group 43, one of the pair of spring piece insertion holes 46 (precisely, the spring piece insertion hole 46 on the +Y side) constituting the fitting hole 44 on the −Y side and one of the other pair of spring piece insertion holes 46 (precisely, the spring piece insertion hole 46 on the −Y side) constituting the fitting hole 44 on the +Y side are adjacent to each other in the Y direction to communicate with each other, thus forming one opening. FIG. 13 is a cross-sectional view taken along line B-B of FIG. 11.

As shown in FIG. 12, the fitting plate 42 has a partition portion 47 separating each pair of spring piece insertion holes 46. Opposite lateral surfaces of the partition portion 47 in the Y direction form inner surfaces of the fitting hole 44, and the ends of the pair of spring pieces 36 inserted in the corresponding pair of spring piece insertion holes 46 elastically sandwich the partition portion 47 at the opposite lateral surfaces thereof in the Y direction when the first connector portion 31 and the second connector portion 41 are fitted with each other (see FIG. 19 to be referred to later).

As shown in FIGS. 1 and 2, the second connector portion 41 has a pair of positioning protrusions 45A and 45B separately formed at the −X and +X side ends of the fitting plate 42. The positioning protrusions 45A and 45B each protrude toward the +Z side and have a shape whose Y directional length changes in two stages as advancing from the base portion to the top portion in the +Z direction. The positioning protrusion 45A on the −X side has the base portion whose Y directional length is smaller than that of the positioning through-hole 28A of the second circuit board 21 on the −X side and larger than that of the positioning through-hole 18A of the first circuit board 11 on the −X side, and the top portion whose Y directional length is smaller than that of the positioning through-hole 18A of the first circuit board 11 on the −X side. The positioning protrusion 45B on the +X side has the base portion whose Y directional length is smaller than that of the positioning through-hole 28B of the second circuit board 21 on the +X side and larger than that of the positioning through-hole 18B of the first circuit board 11 on the +X side, and the top portion whose Y directional length is smaller than that of the positioning through-hole 18B of the first circuit board 11 on the +X side.

Owing to the provision of the positioning protrusions 45A and 45B having the foregoing shapes, when sequentially stacked on the second connector portion 41, the second circuit board 21 and the first circuit board 11 are prevented from being stacked in a wrong order, i.e., in the order of the first circuit board 11 and the second circuit board 21 on the second connector portion 41.

[Process for Assembling Circuit Board Assembly]

When the circuit board assembly is assembled using the first circuit board 11, the second circuit board 21 and the connector C described above, firstly, as shown in FIGS. 1 and 2, the first connector portion 31, the first circuit board 11, the second circuit board 21 and the second connector portion 41 are aligned in this order in the Z direction and adjusted in position. At this time, the first circuit board 11 and the second circuit board 21 are arranged such that the top surface 12A of the first substrate 12 of the first circuit board 11 faces the top surface 22A of the second substrate 22 of the second circuit board 21.

With the first connector portion 31, the first circuit board 11, the second circuit board 21 and the second connector portion 41 being aligned in position, each of the eight second contact portions 24 of the second circuit board 21 faces the corresponding one of the eight first contact portions 14 of the first circuit board 11 in the direction along an XY plane. Thus, in this state, the first contact portion 14 of the first circuit board 11, the second contact portion 24 of the second circuit board 21, and the fitting hole 44 of the second connector portion 41 are situated in order on the −Z side of each of the eight projections 34 of the first connector portion 31.

Figure 14:
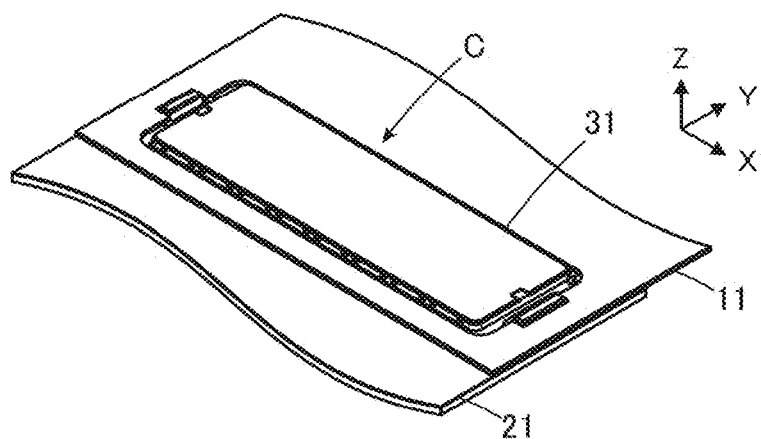
FIG. 14 is a view of the circuit board assembly according to Embodiment 1 after assembling, when viewed from an obliquely upper position.
Figure 15:
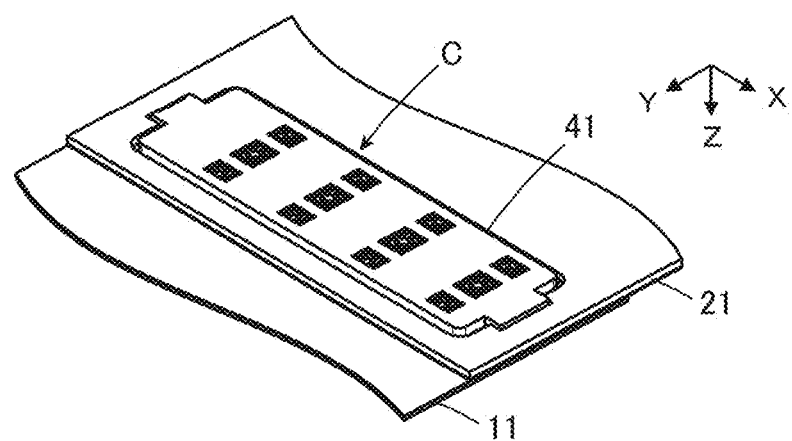
FIG. 15 is a perspective view of the circuit board assembly according to Embodiment 1 after assembling, when viewed from an obliquely lower position.

In this state, the first connector portion 31 is relatively moved in the −Z direction toward the second connector portion 41, whereby the projections 34 of the first connector portion 31 are fitted into the fitting holes 44 of the second connector portion 41 as catching the first contact portions 14 of the first circuit board 11 and the second contact portions 24 of the second circuit board 21. As a result, as shown in FIGS. 14 and 15, the first circuit board 11 and the second circuit board 21 are superposed and sandwiched together between the first connector portion 31 and the second connector portion 41. As a consequence of the assembling as above, the first circuit board 11 and the second circuit board 21 are superposed to allow the first contact portions 14 and the second contact portions 24 to contact each other, and the circuit board assembly is thus completed. FIGS. 14 and 15 are perspective views showing the circuit board assembly having been assembled.

Figure 16:
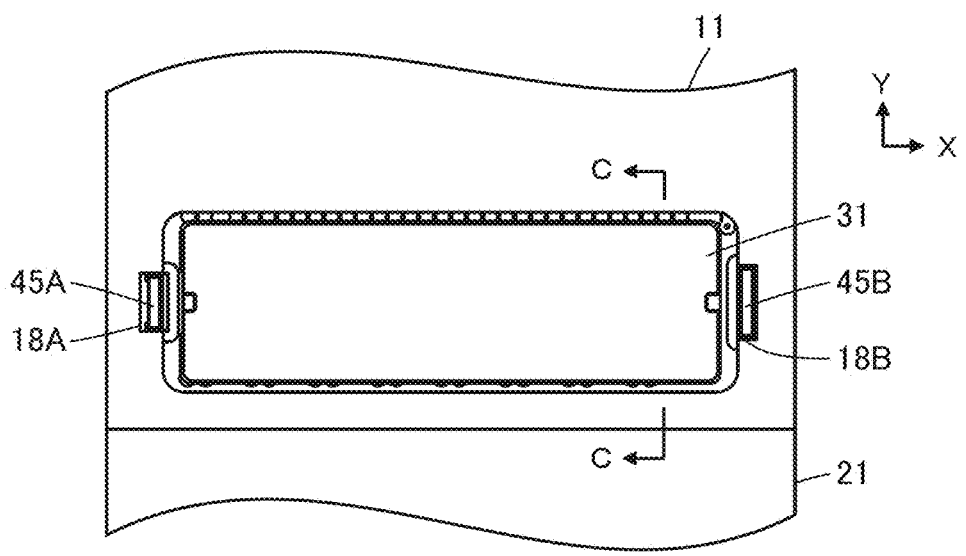
FIG. 16 is a plan view of the circuit board assembly according to Embodiment 1.
Figure 17:
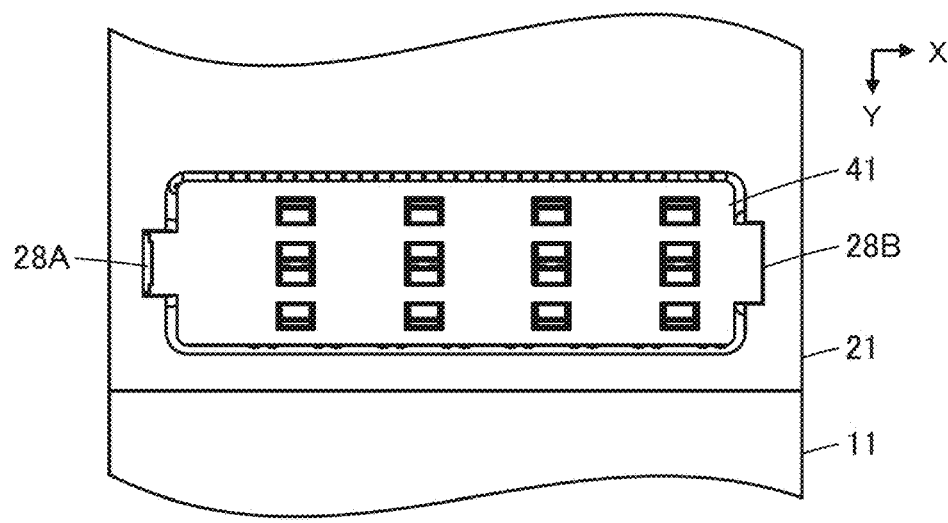
FIG. 17 is a bottom view of the circuit board assembly according to Embodiment 1.

In assembling the circuit board assembly, as shown in FIGS. 16 and 17, the positioning protrusions 45A and 45B of the second connector portion 41 are respectively inserted into the positioning through-holes 28A and 28B of the second circuit board 21 and the positioning through-holes 18A and 18B of the first circuit board 11, whereby the circuit board assembly can easily be assembled without misalignment of the first circuit board 11, the second circuit board 21 and the second connector portion 41 in any direction along an XY plane.

FIGS. 16 and 17 are respectively a plan view and a bottom view of the circuit board assembly having been assembled.

As described above, only by superposing the first circuit board 11 and the second circuit board 21 on each other and fitting the projections 34 of the first connector portion 31 into the fitting holes 44 of the second connector portion 41 via the first contact portions 14 of the first circuit board 11 and the second contact portions 24 of the second circuit board 21, the circuit board assembly can easily be assembled, and the first contact portions 14 and the second contact portions 24 can readily be interconnected correspondingly.

When the circuit board assembly is assembled, in the state where the second connector portion 41 is placed on a fixed surface of, for instance, a workbench, the first connector portion 31 may be pressed down from above against the second connector portion 41 with the second circuit board 21 and the first circuit board 11 being sandwiched therebetween. Alternatively, this may be turned upside down; specifically, in the state where the first connector portion 31 is placed on a fixed surface, the second connector portion 41 may be pressed down from above against the first connector portion 31 with the first circuit board 11 and the second circuit board 21 being sandwiched therebetween.

Figure 18:
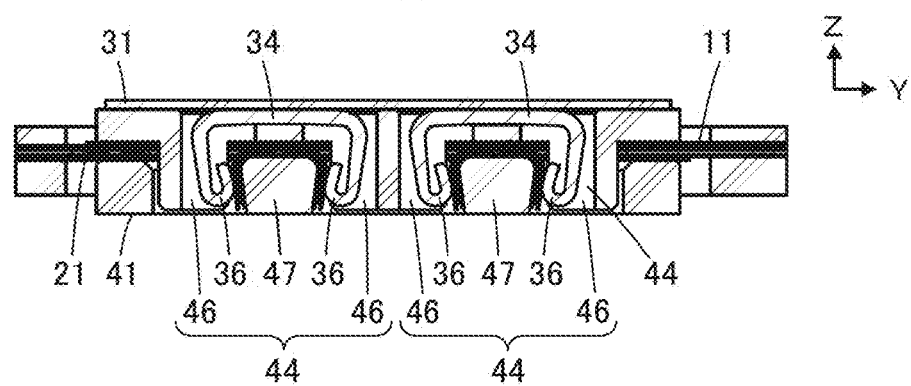
FIG. 18 is a cross-sectional view taken along line C-C in FIG. 16.
Figure 19:
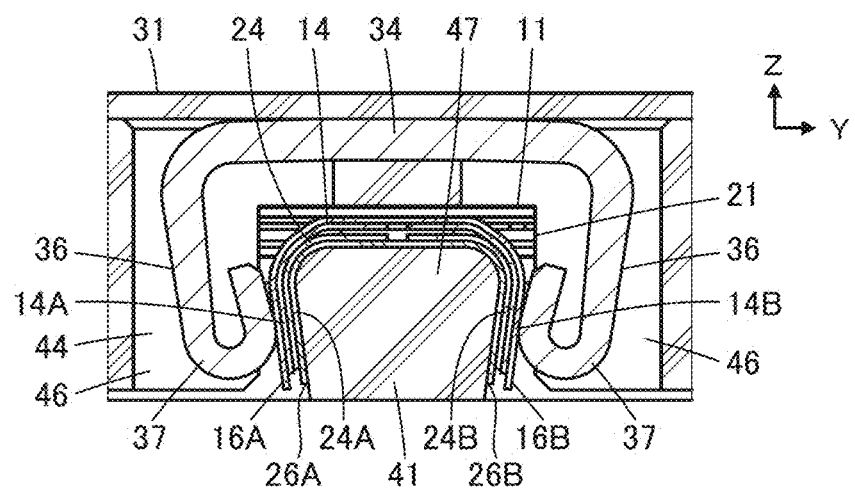
FIG. 19 is an enlarged partial view of FIG. 18 for showing the fitting state between a projection of the first connector portion and a fitting hole of the second connector portion.

FIG. 18 shows a cross section of the circuit board assembly having been assembled, cut along a YZ plane. As shown in FIG. 18, the pair of spring pieces 36 constituting each projection 34 of the first connector portion 31 are inserted in the pair of spring piece insertion holes 46 constituting the corresponding fitting hole 44 of the second connector portion 41. At this time, the pair of first projection pieces 16A and 16B of the corresponding first contact portion 14 of the first circuit board 11 and the pair of second projection pieces 26A and 26B of the corresponding second contact portion 24 of the second circuit board 21 are pushed in the −Z direction by the pair of spring pieces 36. Consequently, the pair of first projection pieces 16A and 16B and the pair of second projection pieces 26A and 26B are bent at their base portions in the −Z direction along the partition portion 47 of the second connector portion 41, as shown in FIG. 19. FIG. 19 is a view showing the fitting state between the projection 34 of the first connector portion 31 and the fitting hole 44 of the second connector portion 41 and is an enlarged partial view of FIG. 18.

Separately and correspondingly, the pairs of first contacts 14A and 14B formed on the pair of first projection pieces 16A and 16B bent in the −Z direction and the pairs of second contacts 24A and 24B formed on the pair of second projection pieces 26A and 26B bent in the −Z direction face and overlap each other, and are sandwiched by the pair of spring pieces 36 constituting the projection 34 and the opposite lateral surfaces, in the Y direction, of the partition portion 47 dividing the fitting hole 44.

In this state, since the pair of spring pieces 36 have elasticity in the Y direction, the first contact portion 14 having the pairs of first contacts 14A and 14B and the second contact portion 24 having the pairs of second contacts 24A and 24B are elastically pressed against each other between the lateral surfaces of the spring pieces 36, which form a lateral surface of the projection 34, and the lateral surfaces of the partition portion 47, which form an inner surface of the fitting hole 44. Accordingly, the first contact portion 14 and the second contact portion 24 reliably contact each other at their first contacts 14A and 14B and second contacts 24A and 24B, and are thus electrically connected to each other. In other words, the connector C is configured such that the projection 34 is fitted into the fitting hole 44 as catching the first contact portion 14 of the first circuit board 11 and the second contact portion 24 of the second circuit board 21 with the first and second contact portions 14 and 24 being superposed to face each other, whereupon the first contact portion 14 and the second contact portion 24 are elastically pressed against and contact each other between the lateral surface of the projection 34 and the inner surface of the fitting hole 44, thus establishing electrical connection.

Figure 20:
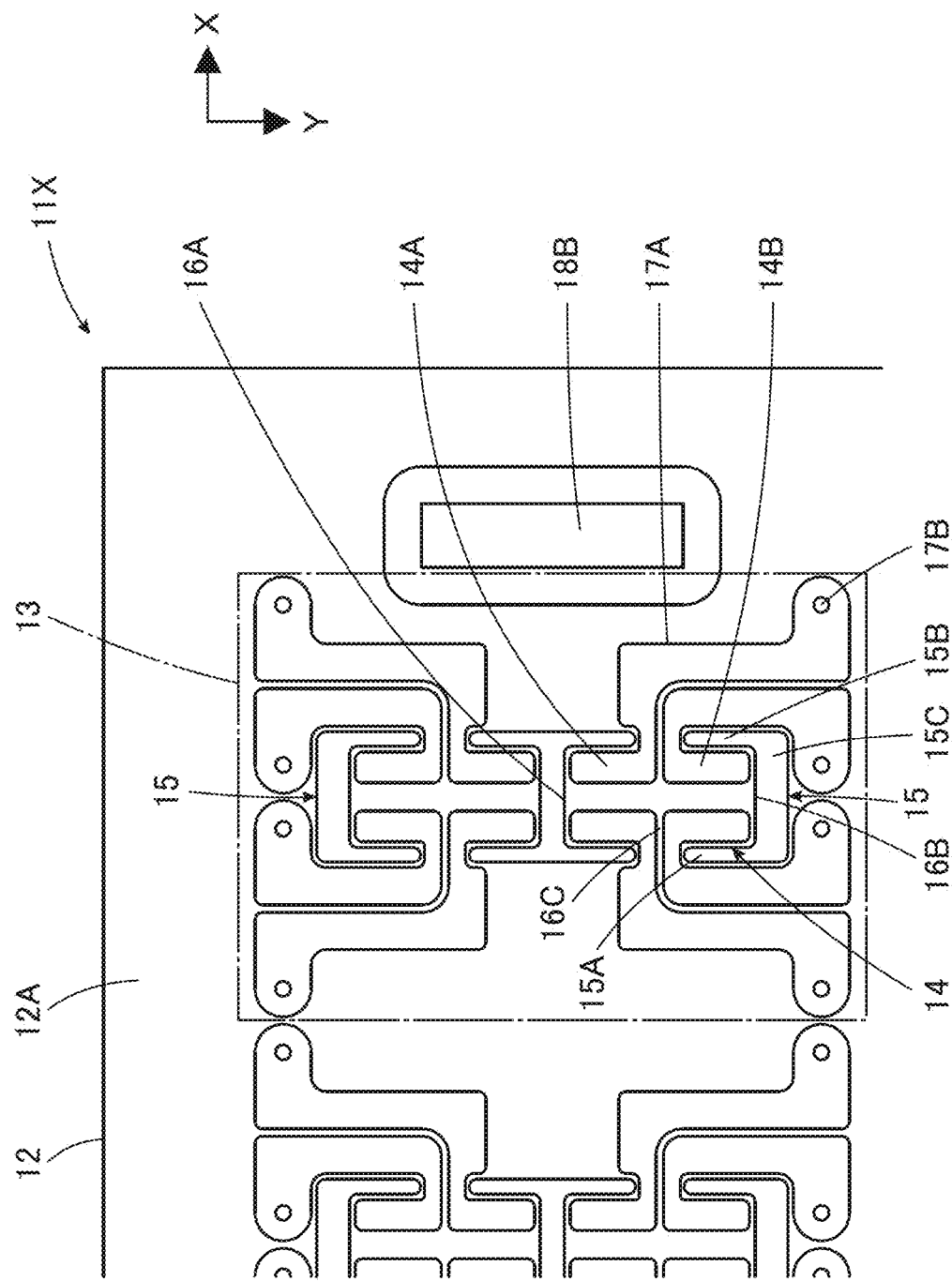
FIG. 20 is a view showing a top surface of a circuit board according to a comparative example.
Figure 21:
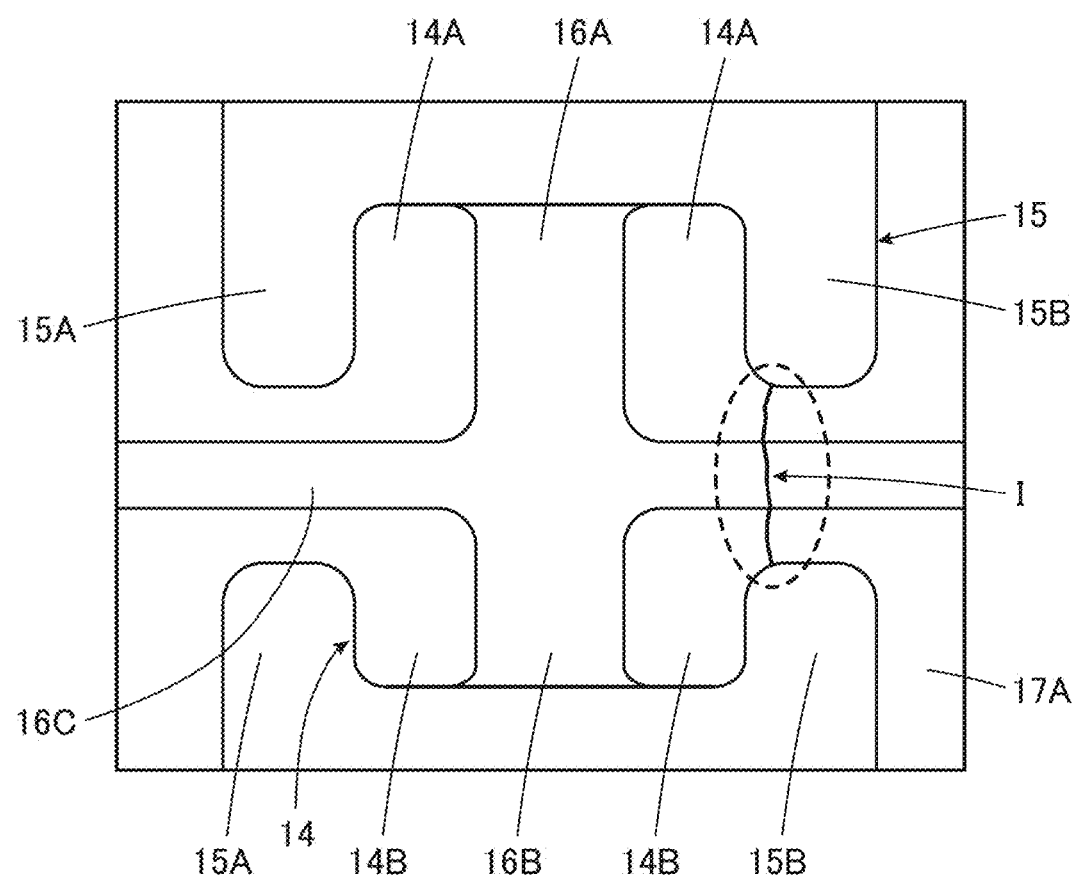
FIG. 21 is an enlarged partial view showing a crack generated in the circuit board.

The assembled circuit board assembly has flexibility and is bendable along the Y direction, and owing to the presence of the first hole 19 in the first circuit board 11 and the second hole 29 in the second circuit board 21, the circuit boards are prevented from being damaged even when the circuit board assembly is bent many times. This effect is described in detail with reference to FIGS. 20 and 21. FIG. 20 is a view showing a surface of a circuit board according to a comparative example, and specifically, an enlarged partial view of a first circuit board 11X with no first hole 19. FIG. 21 is an enlarged partial view of the first contact portion 14 of the first circuit board 11X shown in FIG. 20, showing a crack I (cracking) to be described below.

When a circuit board assembly assembled using the first circuit board 11X (the circuit board according to the comparative example) shown in FIG. 20 is bent along the Y direction, since the pairs of cutout lateral portions 15A and 15B are provided in the first contact portion 14 of the first circuit board 11X, a tensile stress load is imparted to the first contact portion 14 to strain it in the X direction. At this time, tensile stress is concentrated on the narrow portion between the adjacent cutout lateral portions 15A or the adjacent cutout lateral portions 15B adjoining the pair of first projection pieces 16A and 16B (i.e., the portion at either side of the first projection piece joint portion 16C) in the Y direction. Then, as the number of times of bending increases in the comparative example, a crack I as shown in FIG. 21 is to be generated in due course at either of the narrow portions where the tensile stress is concentrated as described above, and a wiring portion (conductive portion) is disconnected at the cracking portion. The similar condition may occur also when a circuit board assembly is assembled using a second circuit board with no second hole 29.

In contrast, in the circuit board assembly of the invention, the first hole 19 is formed in the first circuit board 11 within a range in which the pair of first projection pieces 16A and 16B are present in the X direction. At least part of the first hole 19 is situated between the pair of first projection pieces 16A and 16B in the Y direction (i.e., at the first projection piece joint portion 16C) and at the base portions of the first projection pieces 16A and 16B in the Y direction. The first hole 19 serves to cut the continuity of the first circuit board 11 at the position where the first hole 19 is formed, and when the circuit board assembly is bent along the Y direction, the first hole 19 is widened in the X direction. This reduces the tensile stress concentrated on the narrow portion (i.e., the portion between the cutout lateral portions 15A or the portion between the cutout lateral portions 15B in the Y direction) in the first contact portion 14.

Similarly, the second hole 29 is formed in the second circuit board 21 within a range in which the pair of second projection pieces 26A and 26B are present in the X direction. At least part of the second hole 29 is situated between the pair of second projection pieces 26A and 26B in the Y direction (i.e., at the second projection piece joint portion 26C) and at the base portions of the second projection pieces 26A and 26B in the Y direction. The second hole 29 serves to cut the continuity of the second circuit board 21 at the position where the second hole 29 is formed, and when the circuit board assembly is bent along the Y direction, the second hole 29 is widened in the X direction. This reduces the tensile stress concentrated on the narrow portion (i.e., the portion between the cutout lateral portions 25A or the portion between the cutout lateral portions 25B in the Y direction) in the second contact portion 24.

Thus, even when the circuit board assembly is repeatedly bent along the Y direction, such cracks as the crack I above are prevented from being generated in the circuit boards, thereby avoiding disconnection of the wiring portions that may be caused by cracking.

The first hole 19 is situated in the middle portion of each of the pair of first projection pieces 16A and 16B in the X direction, and is positioned in the Y direction so as to cross the base portions of the pair of first projection pieces 16A and 16B. Similarly, the second hole 29 is situated in the middle portion of each of the pair of second projection pieces 26A and 26B in the X direction, and is positioned in the Y direction so as to cross the base portions of the pair of second projection pieces 26A and 26B. The positioning of the first hole 19 and the second hole 29 as above can effectively reduce the tensile stress load concentrated on the narrow portion in the first contact portion 14 (i.e., the portion between the cutout lateral portions 15A or the portion between the cutout lateral portions 15B in the Y direction) and the narrow portion in the second contact portion 24 (i.e., the portion between the cutout lateral portions 25A or the portion between the cutout lateral portions 25B in the Y direction).

Further, the first hole 19 is situated between the pair of first contacts 14A provided at the opposite end portions of the first projection piece 16A and between the pair of first contacts 14B provided at the opposite end portions of the first projection piece 16B in the X direction. Similarly, the second hole 29 is situated between the pair of second contacts 24A provided at the opposite end portions of the second projection piece 26A and between the pair of second contacts 24B provided at the opposite end portions of the second projection piece 26B in the X direction. Since the contacts on the projection pieces and the holes have the foregoing positional relation, the first hole 19 can fit in the space between the pair of first contacts 14A and the space between the pair of first contacts 14B, and the second hole 29 can fit in the space between the pair of second contacts 24A and the space between the pair of second contacts 24B.

While the first hole 19 formed in each first contact portion 14 of the first circuit board 11 continuously extends in the Y direction from the position where the first hole 19 crosses the base portion of one of the pair of first projection pieces 16A and 16B up to the position where the same crosses the base portion of the other thereof, the invention is not limited thereto, and the first hole 19 may be discontinued (divided into plural holes in the Y direction) between the pair of first projection pieces 16A and 16B. Similarly, while the second hole 29 formed in each second contact portion 24 of the second circuit board 21 continuously extends in the Y direction from the position where the second hole 29 crosses the base portion of one of the pair of second projection pieces 26A and 26B up to the position where the same crosses the base portion of the other thereof, the invention is not limited thereto, and the second hole 29 may be discontinued (divided into plural holes in the Y direction) between the pair of second projection pieces 26A and 26B.

While the first hole 19 is formed between the opposite ends of each of the pair of first projection pieces 16A and 16B in the X direction, the first hole 19 may extend out of the opposite ends of each of the pair of first projection pieces 16A and 16B when formed in the first projection piece joint portion 16C between the pair of first projection pieces 16A and 16B. Similarly, while the second hole 29 is formed between the opposite ends of each of the pair of second projection pieces 26A and 26B in the X direction, the second hole 29 may extend out of the opposite ends of each of the pair of second projection pieces 26A and 26B when formed in the second projection piece joint portion 26C between the pair of second projection pieces 26A and 26B.

Embodiment 2

In Embodiment 1, each of the eight first contact portions 14 of the first circuit board 11 has the pair of first projection pieces 16A and 16B projecting in the opposite directions from (i.e., directions away from) each other in the Y direction, and the first hole 19 is formed at the position to cross the base portions of the pair of first projection pieces 16A and 16B. Further, in Embodiment 1, each of the eight second contact portions 24 of the second circuit board 21 has the pair of second projection pieces 26A and 26B projecting in the opposite directions from (i.e., directions away from) each other in the Y direction, and the second hole 29 is formed at the position to cross the base portions of the pair of second projection pieces 26A and 26B.

Figure 22:
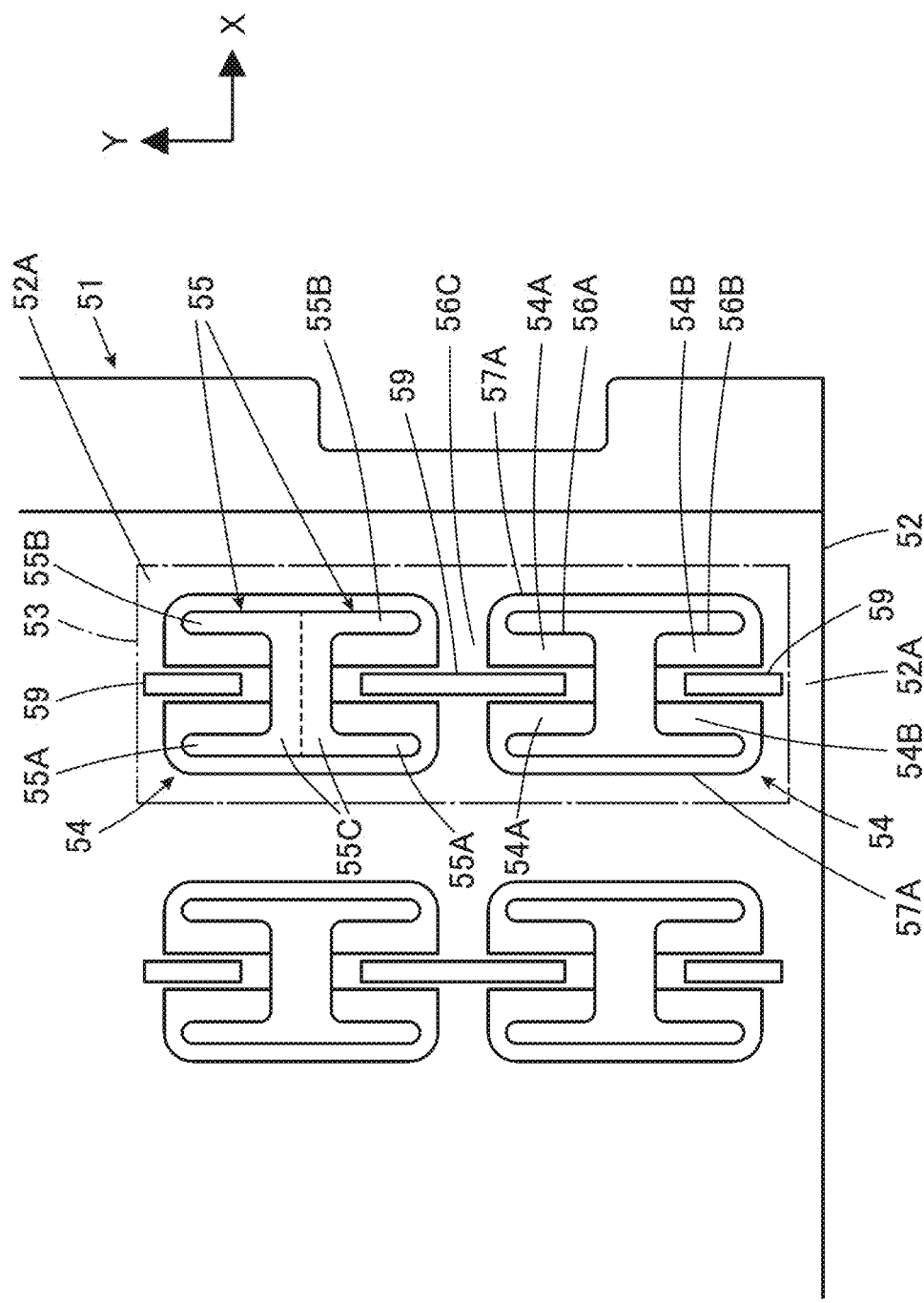
FIG. 22 is an enlarged partial view showing a top surface of a circuit board according to Embodiment 2.

Meanwhile, another embodiment is possible in which first and second circuit boards are configured as shown in FIG. 22 (Embodiment 2). FIG. 22 is a view showing a top surface of a first circuit board 51 according to Embodiment 2. For convenience of illustration, FIG. 22 shows only part of the top surface of the first circuit board 51.

As shown in FIG. 22, the first circuit board 51 according to Embodiment 2 has a plurality of first contact portion groups 53 aligned at regular intervals in the X direction, each first contact portion group 53 being composed of two first contact portions 54 aligned in the Y direction. Each of the two first contact portions 54 of each first contact portion group 53 has a pair of first projection pieces 56A and 56B that are bendable and project to face (i.e., approach) each other in the Y direction. A first cutout portion 55 that is an opening is situated to adjoin the edge of each of the first projection pieces 56A and 56B in the first substrate 52 of the first circuit board 51. The first cutout portion 55 adjoining the edge of the first projection piece 56A and the first cutout portion 55 adjoining the edge of the first projection piece 56B each have a pair of cutout lateral portions 55A and 55B extending in the Y direction and a cutout connecting portion 55C extending in the X direction and interconnecting the pair of cutout lateral portions 55A and 55B. The first cutout portion 55 adjoining the edge of the first projection piece 56A and the first cutout portion 55 adjoining the edge of the first projection piece 56B communicate with each other to form a substantially H-shaped opening because their cutout connecting portions 55C integrally adjoin each other.

On a top surface 52A of the first substrate 52, as shown in FIG. 22, a pair of conductive first contacts 54A are formed separately at the −X side end and the +X side end of the first projection piece 56A, while a pair of conductive first contacts 54B are formed separately at the −X side end and the +X side end of the first projection piece 56B. A conductive portion 57A is provided to form a substantially rectangular shape along each pair of cutout lateral portions 55A and 55B on the top surface 52A of the first substrate 52, and the pair of first contacts 54A in the first projection piece 56A and the pair of first contacts 54B in the first projection piece 56B are electrically connected to each other via the conductive portion 57A.

Of the pairs of first projection pieces 56A and 56B of the two first contact portions 54 adjacent to each other in each first contact portion group 53, two projection pieces adjacent to each other (specifically, the first projection piece 56B projecting toward the +Y side in the first contact portion 54 on the +Y side, and the first projection piece 56A projecting toward the −Y side in the first contact portion 54 on the −Y side) are interconnected via a first projection piece joint portion 56C. As shown in FIG. 22, the first substrate 52 is provided with one first hole 59 that crosses the first projection piece joint portion 56C and the base portions of the first projection pieces 56A and 56B interconnected via the first projection piece joint portion 56C. The first substrate 52 is further provided with other first holes 59 that separately cross the base portions of the first projection pieces 56A and 56B disposed apart from the first projection piece joint portion 56C (specifically, the first projection piece 56A projecting toward the −Y side in the first contact portion 54 on the +Y side, and the first projection piece 56B projecting toward the +Y side in the first contact portion 54 on the −Y side). The respective first holes 59 are situated in the middle portion of the first projection pieces 56A and 56B in the X direction and separated from the pair of first contacts 54A and 54B and the conductive portion 57A.

Although not illustrated, the second circuit board according to Embodiment 2 has the same configuration as the first circuit board 51 described above. Specifically, the second circuit board according to Embodiment 2 has a plurality of second contact portion groups aligned in the X direction, each second contact portion group being composed of two second contact portions aligned in the Y direction. Each of the two second contact portions of each second contact portion group has a pair of second projection pieces that are bendable and project to face (i.e., approach) each other in the Y direction. A second cutout portion that is an opening is situated to adjoin the edge of each of the pair of second projection pieces in the second substrate of the second circuit board. On the top surface of the second substrate, a pair of conductive second contacts are formed separately at the −X side end and the +X side end of each second projection piece, and a conductive portion is provided to form a substantially rectangular shape along the second cutout portions and the base portions of each pair of second projection pieces.

Of the pairs of second projection pieces of the two second contact portions adjacent to each other in each second contact portion group, two projection pieces adjacent to each other are interconnected via a second projection piece joint portion (i.e., a portion corresponding to the first projection piece joint portion 56C in the first circuit board 51). The second substrate is provided with one second hole that crosses the second projection piece joint portion and the base portions of the second projection pieces interconnected via the second projection piece joint portion. The second substrate is further provided with other second holes that separately cross the base portions of the second projection pieces disposed apart from the second projection piece joint portion. The respective second holes are situated in the middle portion of the second projection pieces in the X direction and separated from the pair of second contacts and the conductive portion.

As described above, Embodiment 2 is different from Embodiment 1 in that the pair of first projection pieces 56A and 56B in each first contact portion 54 project to face each other, that the pair of second projection pieces in each second contact portion project to face each other, and that the positions where the first holes and the second holes are formed are changed in accordance with the directions in which the pairs of projection pieces project. Otherwise, the embodiments have the identical configuration, and Embodiment 2 also can achieve the same effect as Embodiment 1.

Figure 23:
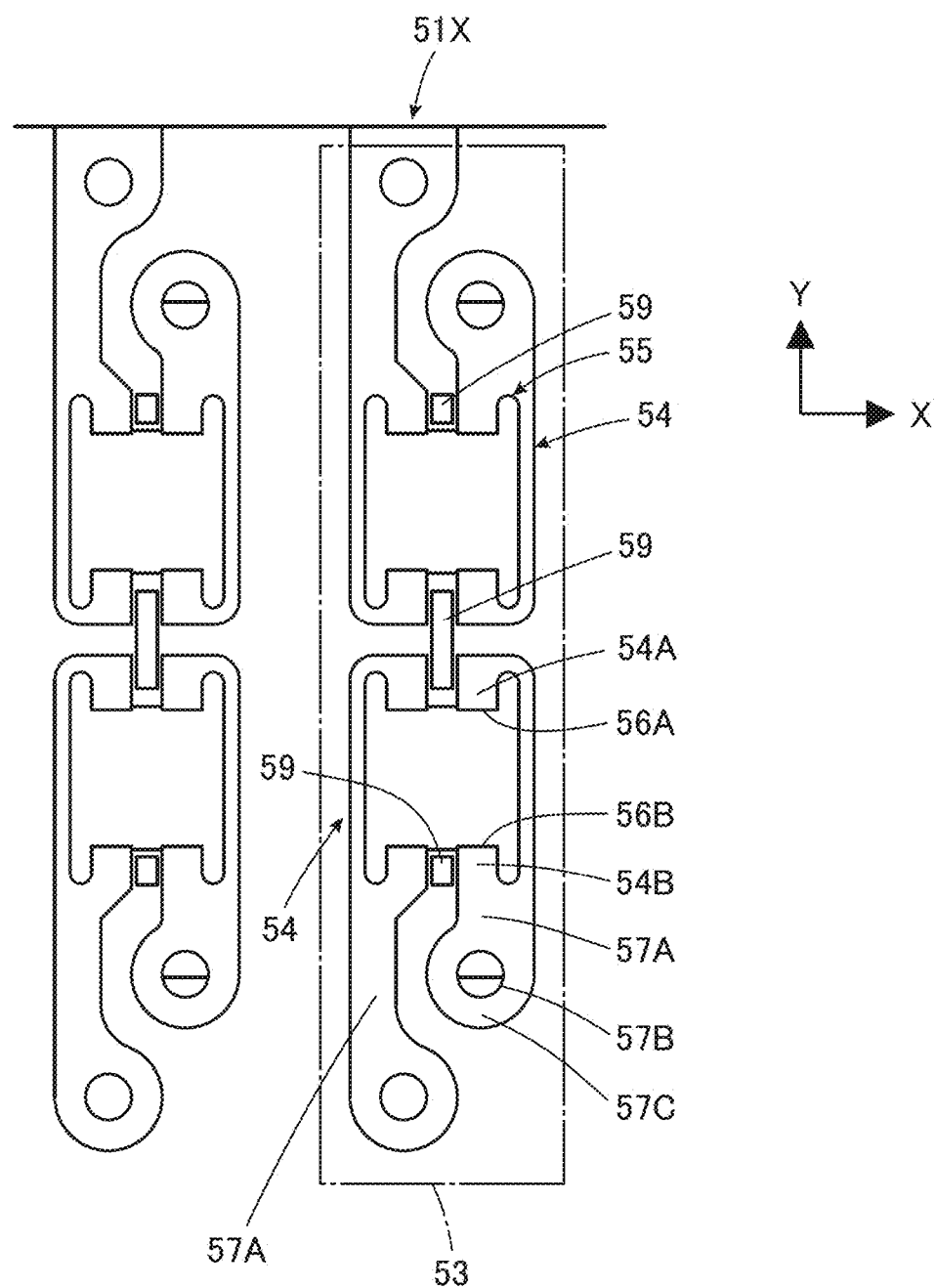
FIG. 23 is an enlarged partial view showing a top surface of a circuit board according to a modification of Embodiment 2.

In Embodiment 2, while the pair of first contacts 54A and the pair of first contacts 54B of each first contact portion 54 of the first circuit board 51 are connected to the conductive portion 57A, as shown in FIG. 23, a pad portion 57C continuous in the Y direction with the conductive portion 57A may be provided on the top surface 52A of the first substrate 52. FIG. 23 is a view showing the top surface of a first circuit board 51X according to a modification of Embodiment 2, and for convenience of illustration, only part of the top surface of the first circuit board 51X is shown.

The pad portion 57C on the top surface 52A side and a pad portion (not shown) on the bottom surface side are electrically connected through a via 57B penetrating the first substrate 52 in the Z direction. In the modification shown in FIG. 23, the first holes 59 are provided at positions away from the first contacts 54A and 54B and the pad portion 57C.

The pad portions as above may be provided in the second circuit board. Specifically, a pad portion continuous with the conductive portion connected to the second contacts on the top surface of the second substrate may be electrically connected to another pad portion on the bottom surface of the second substrate through a via, and the second holes may be provided at positions away from the second contacts and the pad portions in the second substrate.

Embodiment 3

Figure 24:
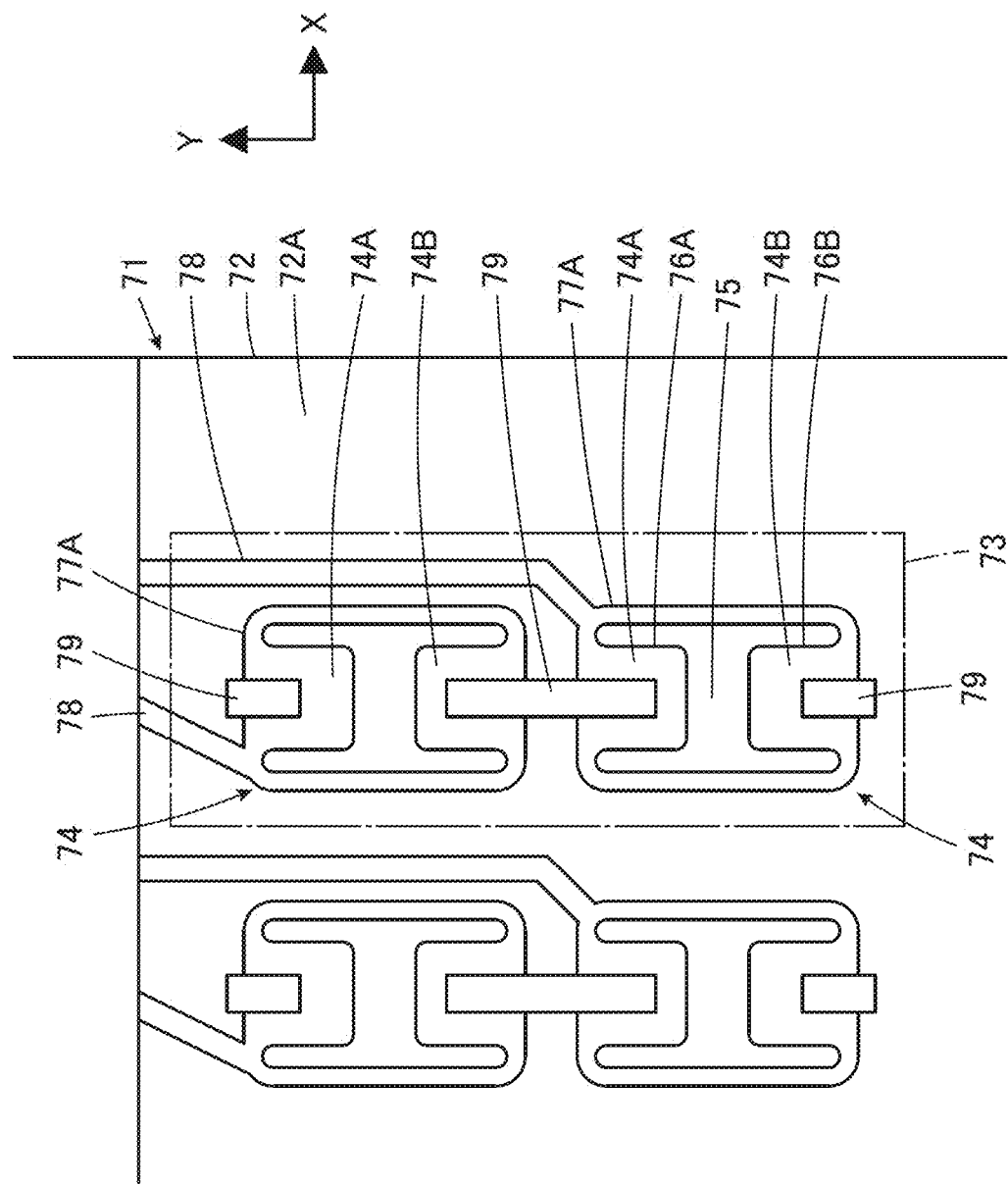
FIG. 24 is an enlarged partial view showing a top surface of a circuit board according to Embodiment 3.

In Embodiment 1, the first hole 19 provided in the first circuit board 11 is separated from the first contacts 14A and 14B, and the second hole 29 provided in the second circuit board 21 is separated from the second contacts 24A and 24B. However, the invention is not limited thereto, and another embodiment is possible in which, for instance, holes are provided to adjoin contacts as shown in FIG. 24 (Embodiment 3). FIG. 24 is a view showing a top surface of a first circuit board 71 according to Embodiment 3. For convenience of illustration, FIG. 24 shows only part of the top surface of the first circuit board 71.

Basically, the first circuit board 71 according to Embodiment 3 has the same configuration as the first circuit board 51 of Embodiment 2. Specifically, as shown in FIG. 24, the first circuit board 71 has a plurality of first contact portion groups 73 aligned in the X direction, each first contact portion group 73 being composed of two first contact portions 74 aligned in the Y direction. Each of the first contact portions 74 has a pair of first projection pieces 76A and 76B that are bendable and project to face each other in the Y direction. A first cutout portion 75 that is a substantially H-shaped opening is situated to adjoin the edge of each of the first projection pieces 76A and 76B in the first substrate 72 of the first circuit board 71. On the top surface 72A of the first substrate 72, as shown in FIG. 24, a pair of first contacts 74A and 74B are formed to entirely cover the pair of first projection pieces 76A and 76B, respectively (precisely, except a portion where the first holes 79 are formed), and the first contacts 74A and 74B are each connected to a first wiring portion 78 via a conductive portion 77A of substantially rectangular shape disposed to surround the pair of first projection pieces 76A and 76B.

The first substrate 72 is provided with one first hole 79 that crosses the base portions of two projection pieces adjacent to each other, of the pairs of first projection pieces 76A and 76B of the two first contact portions 74 adjacent to each other in each first contact portion group 73, and a first projection piece joint portion 76C interconnecting those two projection pieces. The first substrate 72 is further provided with other first holes 79 that separately cross the base portions of the first projection pieces 76A and 76B disposed apart from the first projection piece joint portion 76C. As shown in FIG. 24, the first holes 79 are situated to adjoin the first contacts 74A and 74B and situated in the middle portion of the first projection pieces 76A and 76B in the X direction.

Although not illustrated, the second circuit board according to Embodiment 3 has the same configuration as the first circuit board 71 described above. Specifically, the second circuit board according to Embodiment 3 has a plurality of second contact portion groups aligned in the X direction, each second contact portion group being composed of two second contact portions aligned in the Y direction. Each of the two second contact portions of each second contact portion group has a pair of second projection pieces that are bendable and project to face each other in the Y direction. A second cutout portion that is a substantially H-shaped opening is situated to adjoin the edge of each of the second projection pieces in the second substrate of the second circuit board. On the top surface of the second substrate, second contacts are formed to entirely cover the corresponding second projection pieces, and the second contacts are each connected to a second wiring portion via a conductive portion of substantially rectangular shape disposed to surround the pair of second projection pieces.

The second substrate is provided with one second hole that crosses the base portions of two projection pieces adjacent to each other, of the pairs of second projection pieces of the two second contact portions adjacent to each other in each second contact portion group, and a second projection piece joint portion interconnecting those two projection pieces. The second substrate is further provided with other second holes that separately cross the base portions of the second projection pieces disposed apart from the second projection piece joint portion. The second holes are situated to adjoin the second contacts and situated in the middle portion of the second projection pieces in the X direction.

As described above, Embodiment 3 is different from Embodiment 1 in that the first hole 79 adjoins the first contact 74A, 74B and the second hole adjoins the second contact. Otherwise, the embodiments have the identical configuration, and Embodiment 3 also can achieve the same effect as Embodiment 1.

Embodiment 4

Figure 25:
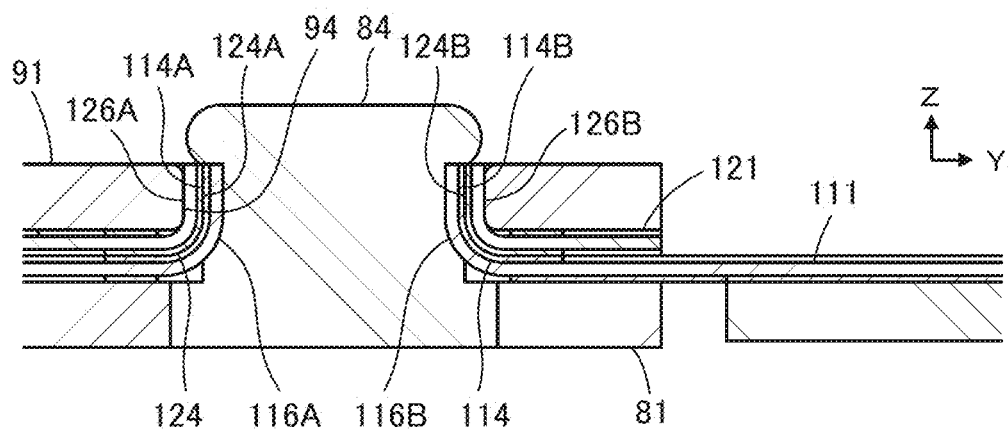
FIG. 25 is a partial cross-sectional view showing the fitting state between a projection of a first connector portion and a fitting hole of a second connector portion in a circuit board assembly according to Embodiment 4.

In Embodiment 1 above, the fitting plate 42 of the second connector portion 41 has the partition portion 47 separating the pair of spring piece insertion holes 46 constituting the fitting hole 44. Also, in Embodiment 1, when the first connector portion 31 and the second connector portion 41 are fitted with each other, the first contact portion 14 of the first circuit board 11 and the second contact portion 24 of the second circuit board 21 are elastically pressed against and contact each other between the lateral surfaces of the pair of spring pieces 36 of the projection 34 of the first connector portion 31 and the opposite lateral surfaces of the partition portion 47 in the fitting hole 44. However, the invention is not limited thereto. For example, another embodiment is possible which uses a first connector portion 81 provided with the projection 84 shaped as shown in FIG. 25 (Embodiment 4). FIG. 25 is a partial cross-sectional view showing the fitting state between the projection 84 of the first connector portion 81 and a fitting hole 94 of a second connector portion 91 in a circuit board assembly according to Embodiment 4.

The projection 84 of the first connector portion 81 according to Embodiment 4 has, for instance, the shape of a substantially quadrangular prism projecting toward the +Z side, is made of an insulating material such as insulating rubber, and has elasticity at least in the Y direction. The fitting hole 94 of the second connector portion 91 according to Embodiment 4 is a through-hole having a substantially rectangular plane shape corresponding to the projection 84 of the first connector portion 81.

A first circuit board 111 according to Embodiment 4 has a first contact portion 114 including: a pair of first projection pieces 116A and 116B projecting in the Y direction to approach each other; and a pair of first contacts 114A and a pair of first contacts 114B that are formed on surfaces of the pair of first projection pieces 116A and 116B, respectively. Although not shown in FIG. 25, the first circuit board 111 is provided with a first hole that crosses the base portions of the pair of first projection pieces 116A and 116B in the Y direction.

Similarly, a second circuit board 121 according to Embodiment 4 has a second contact portion 124 including: a pair of second projection pieces 126A and 126B projecting in the Y direction to face each other; and a pair of second contacts 124A and a pair of second contacts 124B that are formed on surfaces of the pair of second projection pieces 126A and 126B, respectively. Although not shown in FIG. 25, the second circuit board 121 is provided with a second hole that crosses the base portions of the pair of second projection pieces 126A and 126B in the Y direction.

When the first connector portion 81 and the second connector portion 91 according to Embodiment 4 are fitted with each other, the projection 84 of the first connector portion 81 is fitted into the fitting hole 94 of the second connector portion 91 as catching the first contact portion 114 of the first circuit board 111 and the second contact portion 124 of the second circuit board 121 with the first contact portion 114 and the second contact portion 124 facing and being superposed on each other, separately and correspondingly. As a consequence, the first contacts 114A and 114B formed on the pair of first projection pieces 116A and 116B of each first contact portion 114 and the second contacts 124A and 124B formed on the pair of second projection pieces 126A and 126B of each second contact portion 124 are sandwiched by the lateral surface of the projection 84 of the first connector portion 81 and the inner surface of the fitting hole 94 of the second connector portion 91.

Since the projection 84 has elasticity in the Y direction, the first contacts 114A and 114B of each first contact portion 114 and the second contacts 124A and 124B of each second contact portion 124 are elastically pressed against and contact each other between the lateral surface of the projection 84 and the inner surface of the fitting hole 94 and thereby electrically connected to each other in a reliable manner. Even with the use of the projection 84 of the first connector portion 81 and the fitting hole 94 of the second connector portion 91 as above, the first contact portion 114 and the second contact portion 124 can be electrically connected to each other in a stable manner as with Embodiment 1.

Figure 26:
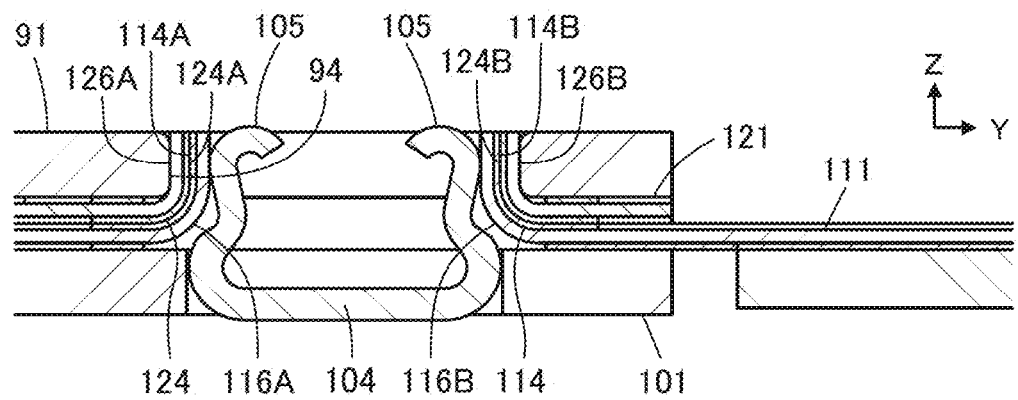
FIG. 26 is a partial cross-sectional view showing the fitting state between a projection of a first connector portion and a fitting hole of a second connector portion in a circuit board assembly according to a modification of Embodiment 4.
Figure 27:
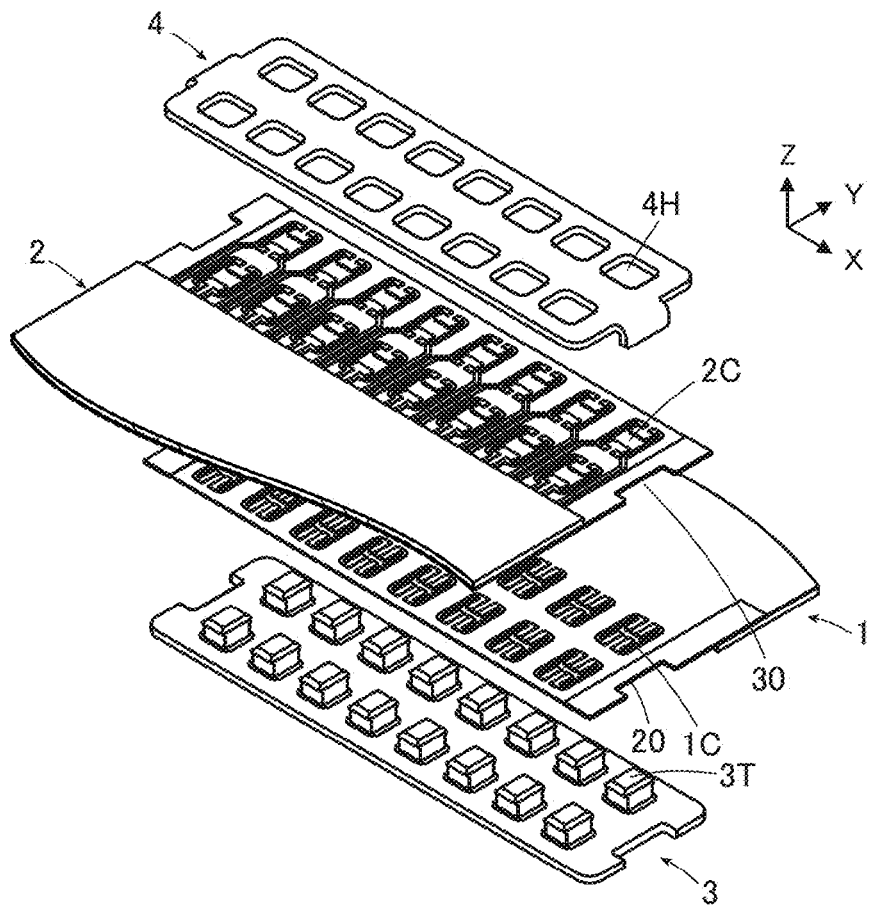
FIG. 27 is a view of a first connector portion, a first circuit board, a second circuit board and a second connector portion of a conventional circuit board assembly before assembling, when viewed from an obliquely upper position.
Figure 28:
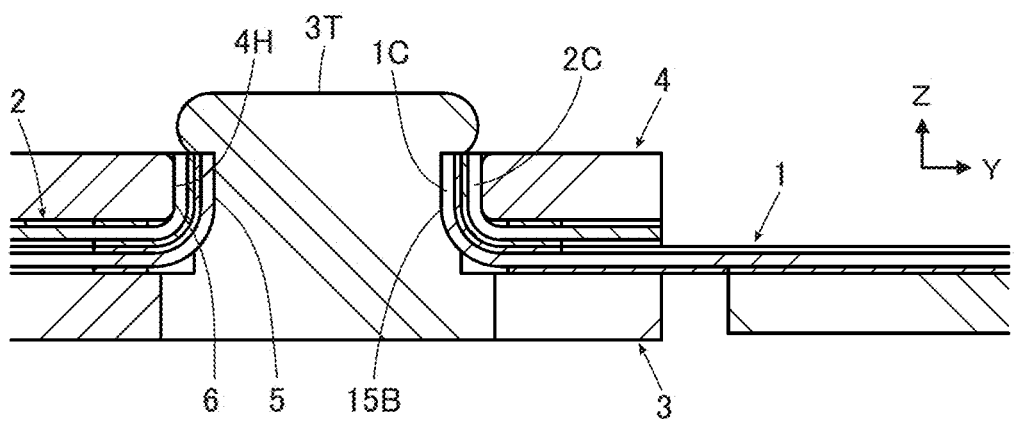
FIG. 28 is a partial cross-sectional view showing the fitting state between a projection of the first connector portion and a fitting hole of the second connector portion in the conventional circuit board assembly.

Even when the first connector portion 81 is replaced by a first connector portion 101 having a projection 104 constituted of a metal spring as shown in FIG. 26, the first contact portion 114 and the second contact portion 124 can be electrically connected to each other. FIG. 26 is a partial cross-sectional view showing the fitting state between the projection 104 of the first connector portion 101 and the fitting hole 94 of the second connector portion 91 in a circuit board assembly according to a modification of Embodiment 4.

The projection 104 has a pair of spring pieces 105 facing each other in the Y direction and having elasticity in the Y direction. Each first contact portion 114 of the first circuit board 111 and the corresponding second contact portion 124 of the second circuit board 121 are sandwiched between lateral surfaces of the pair of spring pieces 105 of the first connector portion 101 and the inner surface of the fitting hole 94 of the second connector portion 91 to be elastically pressed against and contact each other, and electrically connected to each other in a reliable manner.

Other Embodiments

While the projection 34, 84, 104 of the first connector portion 31, 81, 101 has elasticity in the Y direction in the foregoing embodiments, the invention is not limited thereto. With the projection 34, 84, 104 having no elasticity, the partition portion 47 formed in the fitting hole 44 of the second connector portion 41 or the edge portion of the fitting hole 44 may have elasticity in the Y direction. Alternatively, the projection 34, 84, 104 of the first connector portion 31, 81, 101 and either the partition portion 47 formed in the fitting hole 44 of the second connector portion 41 or the edge portion of the fitting hole 44 may both have elasticity in the Y direction.

In the foregoing embodiments, the first contact portion 14, 54, 74, 114 of the first circuit board 11, 11X, 51, 51X, 71, 111 and the second contact portion 24, 124 of the second circuit board 21, 121 are bendable, and the respective contact portions are bent in the assembling process of the circuit board assembly. However, the invention is not limited thereto, and the first and second contact portions may be configured to not bend in the assembling process of the circuit board assembly. Specifically, the circuit board assembly may be assembled by stacking first and second circuit boards that are kept in flat plate shape with their contact portions being not bent.

Further, in the foregoing embodiments, the first hole 19, 59, 79 is provided to cross the relevant base portions of the pair of first projection pieces 16A and 16B, 56A and 56B, 76A and 76B, 116A and 116B of the first contact portion 14, 54, 74, 114; however, it suffices if the first hole is formed within a range in which the first projection piece is present in the X direction and if at least part of the first hole is situated at the base portion of the first projection piece in the Y direction. The first hole need not necessarily cross the base portion of the first projection piece. In other words, an end of the first hole in the Y direction may coincide in position with the base portion of the first projection piece. Alternatively, the first hole may be provided only between the pair of first projection pieces projecting in the opposite directions from each other (i.e., within a range in which the first projection piece joint portion is present) in the Y direction.

Similarly, in the foregoing embodiments, the second hole 29 is provided to cross the relevant base portions of the pair of second projection pieces 26A and 26B, 126A and 126B of the second contact portion 24, 124; however, it suffices if the second hole is formed within a range in which the second projection piece is present in the X direction and if at least part of the second hole is situated at the base portion of the second projection piece in the Y direction. The second hole need not necessarily cross the base portion of the second projection piece. In other words, an end of the second hole in the Y direction may coincide in position with the base portion of the second projection piece. Alternatively, the second hole may be provided only between the pair of second projection pieces projecting in the opposite directions from each other (i.e., within a range in which the second projection piece joint portion is present) in the Y direction.

What is claimed is:

1. A circuit board assembly that is constructed by stacking a first circuit board having a first contact portion and a second circuit board having a second contact portion to allow the first contact portion and the second contact portion to contact each other and that is bendable along a first direction, the circuit board assembly comprising:
   a pair of first projection pieces that are formed by cutting the first circuit board in the first contact portion and project in opposite directions from each other in the first direction; and
   a pair of second projection pieces that are formed by cutting the second circuit board in the second contact portion and project in opposite directions from each other in the first direction,
   wherein the first circuit board comprises:
      a first cutout portion adjoining the first projection piece; and
      a first hole formed at a position away from the first cutout portion within a range in which the pair of first projection pieces are present in a second direction perpendicular to the first direction, at least part of the first hole being situated between the pair of first projection pieces in the first direction, and
   wherein the second circuit board comprises:
      a second cutout portion adjoining the second projection piece; and
      a second hole formed at a position away from the second cutout portion within a range in which the pair of second projection pieces are present in the second direction, at least part of the second hole being situated between the pair of second projection pieces in the first direction.

2. A circuit board assembly that is constructed by stacking a first circuit board having a first contact portion and a second circuit board having a second contact portion to allow the first contact portion and the second contact portion to contact each other and that is bendable along a first direction, the circuit board assembly comprising:
   a first projection piece formed by cutting the first circuit board in the first contact portion; and
   a second projection piece formed by cutting the second circuit board in the second contact portion,
   wherein the first circuit board comprises:
      a first cutout portion adjoining the first projection piece; and
      a first hole formed at a position away from the first cutout portion within a range in which the first projection piece is present in a second direction perpendicular to the first direction, at least part of the first hole being situated at a base portion of the first projection piece in the first direction, and
   wherein the second circuit board comprises:
      a second cutout portion adjoining the second projection piece; and
      a second hole formed at a position away from the second cutout portion within a range in which the second projection piece is present in the second direction, at least part of the second hole being situated at a base portion of the second projection piece in the first direction.

3. The circuit board assembly according to claim 1, wherein the first hole is formed between opposite ends of the first projection piece in the second direction, and
   wherein the second hole is formed between opposite ends of the second projection piece in the second direction.

4. The circuit board assembly according to claim 3, wherein the first hole is situated in a middle portion, in the second direction, of the first projection piece, and
   wherein the second hole is situated in a middle portion, in the second direction, of the second projection piece.

5. The circuit board assembly according to claim 1, further comprising:
   a connector including a first connector portion having a projection provided on a surface of a base plate and a second connector portion having a fitting hole formed in a fitting plate,
   wherein the first contact portion is bendable at a base portion of the first projection piece,
   wherein the second contact portion is bendable at a base portion of the second projection piece, and
   wherein the connector is configured such that the projection is fitted into the fitting hole as catching the first contact portion of the first circuit board and the second contact portion of the second circuit board with the first contact portion and the second contact portion facing and being superposed on each other, whereupon the first contact portion and the second contact portion are elastically pressed against and contact each other between a lateral surface of the projection and an inner surface of the fitting hole and electrically connected to each other.

6. The circuit board assembly according to claim 1, wherein each of the first cutout portion and the second cutout portion has a pair of cutout lateral portions extending in the first direction and a cutout connecting portion extending in the second direction to interconnect the pair of cutout lateral portions.

7. The circuit board assembly according to claim 6, wherein a terminal end of each of the pair of cutout lateral portions of the first cutout portion adjoins a base portion of the first projection piece,
   wherein the first hole is formed at a location in the first direction to cross the base portion of the first projection piece,
   wherein a terminal end of each of the pair of cutout lateral portions of the second cutout portion adjoins a base portion of the second projection piece, and
   wherein the second hole is formed at a location in the first direction to cross the base portion of the second projection piece.

8. The circuit board assembly according to claim 1, wherein the first contact portion and the second contact portion contact each other at a first contact formed in the first projection piece and a second contact formed in the second projection piece,
- wherein the first hole is provided at a position away from a first wiring portion connected to the first contact in the first circuit board, and
- wherein the second hole is provided at a position away from a second wiring portion connected to the second contact in the second circuit board.

9. The circuit board assembly according to claim 8, wherein in the first circuit board, the first contact is provided at each of opposite end portions of the first projection piece in the second direction, and the first hole is provided between the first contacts in the second direction, and
- wherein in the second circuit board, the second contact is provided at each of opposite end portions of the second projection piece in the second direction, and the second hole is provided between the second contacts in the second direction.

10. The circuit board assembly according to claim 1, wherein the first hole and the second hole extend along the first direction.

11. The circuit board assembly according to claim 10, wherein one end of the first hole closer to a free end of the first projection piece in the first direction is separated from the free end of the first projection piece, and
- wherein one end of the second hole closer to a free end of the second projection piece in the first direction is separated from the free end of the second projection piece.

12. The circuit board assembly according to claim 11, wherein the first contact portion has a pair of the first projection pieces aligned in the first direction,
- wherein the first circuit board has the first hole formed to cross a base portion in each of the pair of the first projection pieces,
- wherein the second contact portion has a pair of the second projection pieces aligned in the first direction, and
- wherein the second circuit board has the second hole formed to cross a base portion in each of the pair of the second projection pieces.

13. The circuit board assembly according to claim 11, wherein the first circuit board has a plurality of the first contact portions aligned in the first direction,
- wherein the first projection pieces of each of adjacent two first contact portions in the plurality of the first contact portions are interconnected via a first projection piece joint portion, the adjacent two first contact portions being aligned in the first direction,
- wherein the first hole is formed to cross the first projection piece joint portion and a base portion in each of the first projection pieces interconnected via the first projection piece joint portion,
- wherein the second circuit board has a plurality of the second contact portions aligned in the first direction,
- wherein the second projection pieces of each of adjacent two second contact portions in the plurality of the second contact portions are interconnected via a second projection piece joint portion, the adjacent two second contact portions being aligned in the first direction, and
- wherein the second hole is formed to cross the second projection piece joint portion and a base portion in each of the second projection pieces interconnected via the second projection piece joint portion.

14. The circuit board assembly according to claim 2, wherein the first hole is formed between opposite ends of the first projection piece in the second direction, and
- wherein the second hole is formed between opposite ends of the second projection piece in the second direction.

15. The circuit board assembly according to claim 14, wherein the first hole is situated in a middle portion, in the second direction, of the first projection piece, and
- wherein the second hole is situated in a middle portion, in the second direction, of the second projection piece.

16. The circuit board assembly according to claim 2, further comprising:
- a connector including a first connector portion having a projection provided on a surface of a base plate and a second connector portion having a fitting hole formed in a fitting plate,
- wherein the first contact portion is bendable at the base portion of the first projection piece,
- wherein the second contact portion is bendable at the base portion of the second projection piece, and
- wherein the connector is configured such that the projection is fitted into the fitting hole as catching the first contact portion of the first circuit board and the second contact portion of the second circuit board with the first contact portion and the second contact portion facing and being superposed on each other, whereupon the first contact portion and the second contact portion are elastically pressed against and contact each other between a lateral surface of the projection and an inner surface of the fitting hole and electrically connected to each other.

17. The circuit board assembly according to claim 2, wherein each of the first cutout portion and the second cutout portion has a pair of cutout lateral portions extending in the first direction and a cutout connecting portion extending in the second direction to interconnect the pair of cutout lateral portions.

18. The circuit board assembly according to claim 17, wherein a terminal end of each of the pair of cutout lateral portions of the first cutout portion adjoins the base portion of the first projection piece,
- wherein the first hole is formed at a location in the first direction to cross the base portion of the first projection piece,
- wherein a terminal end of each of the pair of cutout lateral portions of the second cutout portion adjoins the base portion of the second projection piece, and
- wherein the second hole is formed at a location in the first direction to cross the base portion of the second projection piece.

19. The circuit board assembly according to claim 2, wherein the first contact portion and the second contact portion contact each other at a first contact formed in the first projection piece and a second contact formed in the second projection piece,
- wherein the first hole is provided at a position away from a first wiring portion connected to the first contact in the first circuit board, and
- wherein the second hole is provided at a position away from a second wiring portion connected to the second contact in the second circuit board.

20. The circuit board assembly according to claim 19, wherein in the first circuit board, the first contact is provided at each of opposite end portions of the first projection piece in the second direction, and the first hole is provided between the first contacts in the second direction, and wherein in the second circuit board, the second contact is provided at each of opposite end portions of the second projection piece in the second direction, and the second hole is provided between the second contacts in the second direction.

21. The circuit board assembly according to claim 2, wherein the first hole and the second hole extend along the first direction.

22. The circuit board assembly according to claim 21, wherein one end of the first hole closer to a free end of the first projection piece in the first direction is separated from the free end of the first projection piece, and wherein one end of the second hole closer to a free end of the second projection piece in the first direction is separated from the free end of the second projection piece.

23. The circuit board assembly according to claim 22, wherein the first contact portion has a pair of the first projection pieces aligned in the first direction, wherein the first circuit board has the first hole formed to cross a base portion in each of the pair of the first projection pieces, wherein the second contact portion has a pair of the second projection pieces aligned in the first direction, and wherein the second circuit board has the second hole formed to cross a base portion in each of the pair of the second projection pieces.

* * * * *